(12) United States Patent
Hashiguchi et al.

(10) Patent No.: US 10,484,101 B2
(45) Date of Patent: Nov. 19, 2019

(54) TRANSMITTER/RECEIVER AND TRANSMITTING/RECEIVING METHOD

(71) Applicant: SONY CORPORATION, Tokyo (JP)

(72) Inventors: Takaaki Hashiguchi, Tokyo (JP); Yoshiyuki Akiyama, Kanagawa (JP); Masahiro Uno, Tokyo (JP)

(73) Assignee: SONY CORPORATION, Tokyo (JP)

( * ) Notice: Subject to any disclaimer, the term of this patent is extended or adjusted under 35 U.S.C. 154(b) by 0 days.

(21) Appl. No.: 15/773,812

(22) PCT Filed: Nov. 11, 2016

(86) PCT No.: PCT/JP2016/083477
§ 371 (c)(1),
(2) Date: May 4, 2018

(87) PCT Pub. No.: WO2017/090461
PCT Pub. Date: Jun. 1, 2017

(65) Prior Publication Data
US 2018/0323881 A1 Nov. 8, 2018

(30) Foreign Application Priority Data
Nov. 27, 2015 (JP) .................................. 2015-231889

(51) Int. Cl.
*H04B 13/00* (2006.01)
*H04L 1/00* (2006.01)
(Continued)

(52) U.S. Cl.
CPC ............ *H04B 13/005* (2013.01); *H04B 5/02* (2013.01); *H04L 1/0061* (2013.01); *H03M 13/09* (2013.01)

(58) Field of Classification Search
CPC ........ H04B 13/005; H04B 5/02; H04B 13/00; H04B 1/3827; H03M 13/09; H04L 1/0061;
(Continued)

(56) References Cited

U.S. PATENT DOCUMENTS

| 8,467,840 B2* | 6/2013 | Lin | ........................ | H01Q 1/245 |
| | | | | 455/550.1 |
| 8,649,833 B1* | 2/2014 | Lee | ........................ | H01Q 5/335 |
| | | | | 455/575.7 |

(Continued)

OTHER PUBLICATIONS

Hachisuga, et al., "Signal Transmission Modeling of the Intrabody Communication and Experimental Analyses", Journal of the Japan Institute of Electronics Packaging, vol. 10, Issue 6, 2007, pp. 462-468.

(Continued)

*Primary Examiner* — Pablo N Tran
(74) *Attorney, Agent, or Firm* — Chip Law Group

(57) ABSTRACT

The present technology relates to a transmitter/receiver and a transmitting/receiving method capable of suppressing deterioration of transmission efficiency during reception while maintaining transmission efficiency during transmission. A first electrode is provided close to a communication medium, a second electrode is provided in a manner facing the first electrode, and a third electrode is provided close to the communication medium together with the first electrode. A transmission circuit is connected to the first electrode and the second electrode so as to transmit a signal, and a reception circuit is connected to the first electrode and the second electrode so as to receive the signal. A switch electrically connects the second electrode to the third electrode, and an electrode control unit controls electrical connection between the second electrode and the third electrode by turning ON/OFF the switch. The present technology can be applied to, for example, a transmitter/receiver that transmits and receives a signal via a human body.

15 Claims, 24 Drawing Sheets

(51) Int. Cl.
*H04B 5/02* (2006.01)
*H03M 13/09* (2006.01)

(58) Field of Classification Search
CPC .. H04L 1/00; A61B 5/00; A61B 5/053; A61B 5/6898; H04W 4/80
See application file for complete search history.

(56) References Cited

U.S. PATENT DOCUMENTS

| | | | | |
|---|---|---|---|---|
| 8,686,297 | B2* | 4/2014 | Shiu | H05K 1/028 174/250 |
| 8,723,749 | B2* | 5/2014 | Lin | H01Q 5/328 343/772 |
| 8,725,213 | B2* | 5/2014 | Nakamura | H01Q 1/243 455/550.1 |
| 9,231,293 | B2* | 1/2016 | Park | H01Q 1/243 |
| 9,407,335 | B2* | 8/2016 | Ramasamy | H04B 7/0404 |
| 9,502,768 | B2* | 11/2016 | Huang | H01Q 1/002 |
| 9,813,532 | B2* | 11/2017 | Kim | H04M 1/026 |
| 10,128,560 | B2* | 11/2018 | Heng | H01Q 1/243 |
| 2004/0214621 | A1* | 10/2004 | Ponce De Leon | H01Q 1/242 455/575.8 |
| 2012/0329524 | A1* | 12/2012 | Kent | G06F 3/044 455/566 |
| 2013/0241796 | A1* | 9/2013 | Nagumo | H01Q 1/243 343/861 |

OTHER PUBLICATIONS

Koshiji, et al., "Impedance Matching and Electrode Structure Design for Wearable Transmitter in Intra-Body Transmission", Journal of the Japan Institute of Electronics Packaging, vol. 12, Issue 3, 2009, pp. 221-232.

Muramatsu, et al., "Study on Structural Design of Transmitter Electrodes and Surrounding Electric Field for Human Body Communication Based on Impedance Matching", Journal of Life Support Engineering, vol. 24, Issue 2, 2012, pp. 70-78.

Yokoyama, et al., "Relation of the Position and the Structure of the Electrode for the Device Using Human Body Communication", The University of Tokyo, 2011, pp. 954-955.

International Search Report and Written Opinion of PCT Application No. PCT/JP2016/083477, dated Jan. 31, 2017, 09 pages of ISRWO.

Hachisuka, et al., "Signal Transmission Modeling of the Intrabody Communication and Experimental Analyses", Japan Institute of Electronics Packaging (JEEP), vol. 10 No. 6, 2007, 09 pages.

Koshiji, et al., "Impedance Matching and Electrode Structure Design for Wearable Transmitter in Intra-Body Transmission", Japan Institute of Electronics Packaging (JEEP), vol. 12, No. 3, 2009, pp. 221-264.

Muramatsu, et al., "Study on Structural Design of Transmitter Electrodes and Surrounding Electric Field for Human Body Communication Based on Impedance Matching", vol. 24, No. 2, 2012, pp. 70-78.

Haga, et al., "Equivalent Circuit of Intrabody Communication Channels Inducing Conduction Currents Inside the Human Body", IEEE Transactions on Antennas and Propagation, vol. 61, No. 5, May 2013, pp. 2807-2816.

Hachisuka, et al., "Signal Transmission Modeling of the Intrabody Communication and Experimental Analyses", Japan Institute of Electronics Packaging (JIEP), vol. 10, No. 6 (2007), pp. 462-508.

Koshiji, et al., "Impedance Matching and Electrode Structure Design for Wearable Transmitter in Intra-Body Transmission", Japan Institute of Electronics Packaging (JIEP), vol. 12, No. 3 (2009), pp. 221-264.

* cited by examiner

TRANSMITTER/RECEIVER AND TRANSMITTING/RECEIVING METHOD

CROSS REFERENCE TO RELATED APPLICATIONS

This application is a U.S. National Phase of International Patent Application No. PCT/JP2016/083477 filed on Nov. 11, 2016, which claims priority benefit of Japanese Patent Application No. JP 2015-231889 filed in the Japan Patent Office on Nov. 27, 2015. Each of the above-referenced applications is hereby incorporated herein by reference in its entirety.

TECHNICAL FIELD

The present technology relates to a transmitter/receiver and a transmitting/receiving method, and particularly relates to a transmitter/receiver and a transmitting/receiving method capable of improving transmission efficiency.

BACKGROUND ART

In the related art, there is a known communication technology in which a human body is used as a communication medium.

For example, an electrode configuration that improves transmission efficiency during transmission is disclosed in Non-Patent Document 1.

CITATION LIST

Non-Patent Document

Non-Patent Document 1: N. Haga, K. Saito, M. Takahashi, and K. Ito "Equivalent Circuit of Intrabody Communication Channels Inducing Conduction Currents Inside the Human Body" IEEE Transactions on Antennas and Propagation., vol. 61, no. 5, pp. 2807-2816, May 2013.

SUMMARY OF THE INVENTION

Problems to be Solved by the Invention

However, according to an electrode configuration disclosed in Non-Patent Document 1, transmission efficiency during reception is deteriorated.

The present technology is made in view of such a situation and directed to suppressing deterioration of transmission efficiency during reception while maintaining transmission efficiency during transmission.

Solutions to Problems

A transmitter/receiver according to the present technology includes: a first electrode provided close to a communication medium; a second electrode provided in a manner facing the first electrode; a third electrode provided close to the communication medium together with the first electrode; a transmission circuit connected to the first electrode and the second electrode so as to transmit a signal; a reception circuit connected to the first electrode and the second electrode so as to receive the signal; a switch adapted to electrically connect the second electrode to the third electrode; and an electrode control unit adapted to control electrical connection between the second electrode and the third electrode by turning ON/OFF the switch.

A transmitting/receiving method according to the present technology includes controlling electrical connection between a second electrode and a third electrode by a transmitter/receiver turning ON/OFF a switch, in which the transmitter/receiver includes: a first electrode provided close to a communication medium; the second electrode provided in a manner facing the first electrode; the third electrode provided close to the communication medium together with the first electrode; a transmission circuit connected to the first electrode and the second electrode so as to transmit a signal; a reception circuit connected to the first electrode and the second electrode so as to receive the signal; and the switch adapted to electrically connect the second electrode to the third electrode.

In the present technology, the first electrode is provided close to the communication medium, the second electrode is provided in a manner facing the first electrode, the third electrode is provided close to the communication medium together with the first electrode, and electrical connection between the second electrode and the third electrode is controlled by turning ON/OFF the switch.

Effects of the Invention

According to the present technology, deterioration of transmission efficiency during reception can be suppressed while maintaining transmission efficiency during transmission.

MODE FOR CARRYING OUT THE INVENTION

In the following, an embodiment of the present technology will be described with reference to the drawings.

Communication System in Related Art

Figure 1:
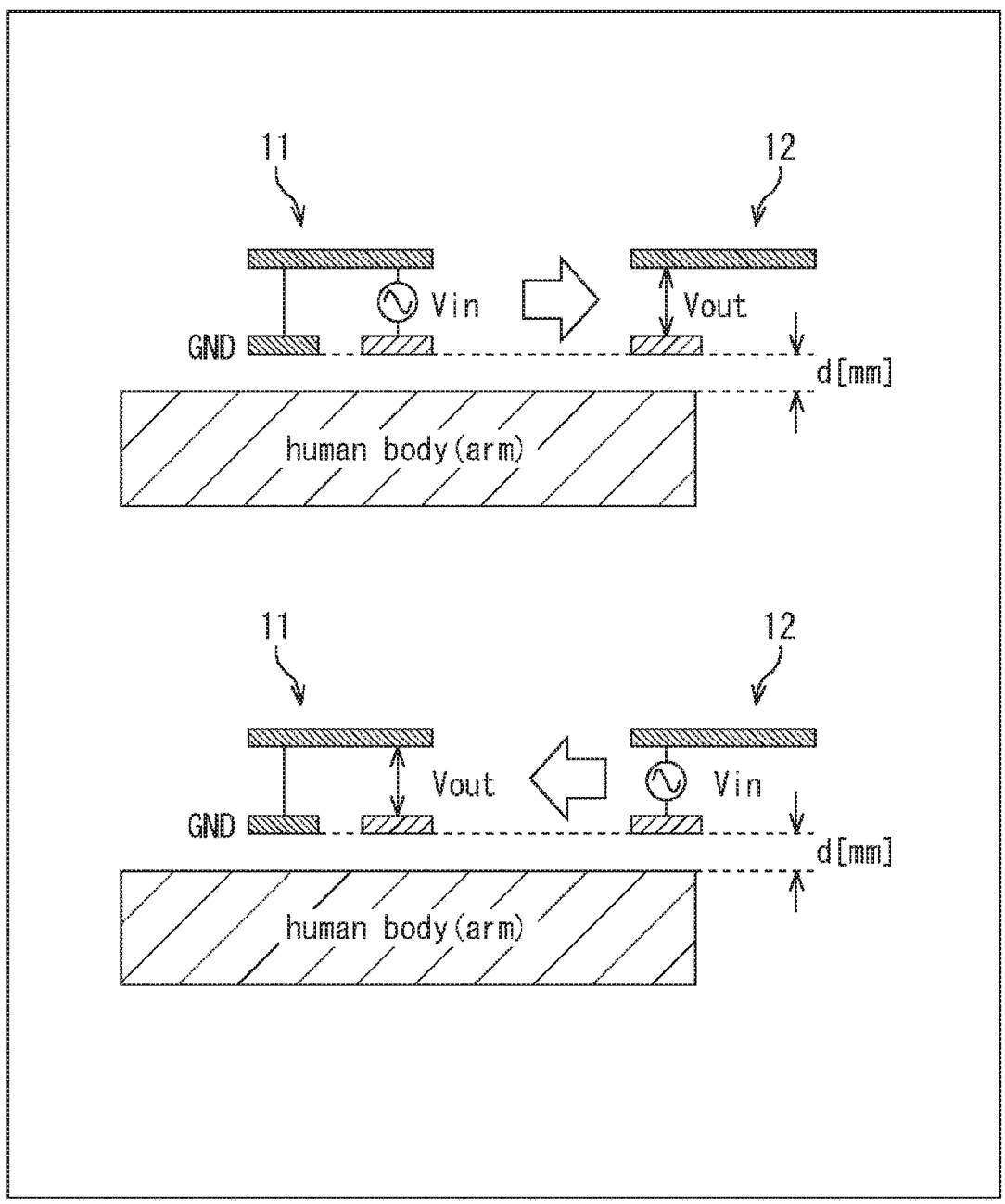
FIG. 1 is a diagram illustrating an exemplary configuration of a communication system in the related art.

FIG. 1 illustrates an exemplary configuration of a communication system in the related art.

In an upper portion of FIG. 1, illustrated is a state in which a transmitter/receiver 11 transmits a signal to a transmitter/receiver 12 via a human body (arm) serving as a communication medium. In a lower portion of FIG. 1, illustrated is a state in which the transmitter/receiver 11 receives a signal from the transmitter/receiver 12 via the human body (arm) serving as the communication medium.

The transmitter/receiver 11 transmits a signal to the transmitter/receiver 12 by generating, between a first electrode provided on a human body side and a second electrode provided in a manner facing the first electrode, an electric signal (potential difference) to be transmitted to the transmitter/receiver 12. On the other hand, the transmitter/receiver 11 receives a signal from the transmitter/receiver 12 by restoring an electric signal (potential difference) generated between the first electrode and the second electrode. In the transmitter/receiver 11, it is assumed that the second electrode is connected to GND. Additionally, in the transmitter/receiver 11, a third electrode is provided on the human body side together with the first electrode.

Meanwhile, Non-Patent Document 1 discloses that a third electrode is connected to a second electrode (GND) in the transmitter/receiver 11 in order to improve transmission efficiency during transmission.

Figure 2:
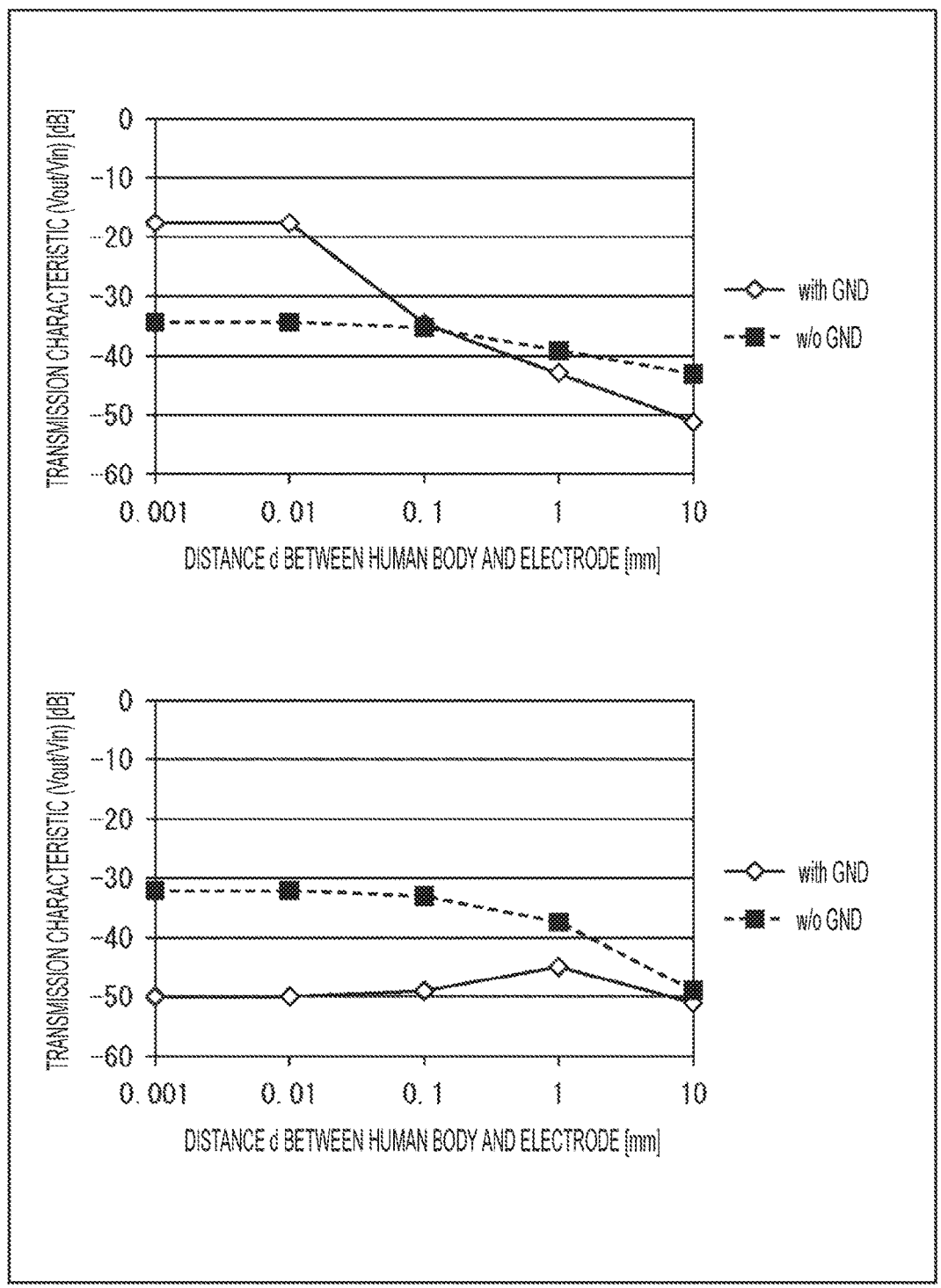
FIG. 2 is a diagram illustrating transmission characteristics of the communication system during transmission and reception in the related art.

FIG. 2 illustrates transmission characteristics of the communication system during transmission and reception in the related art.

An upper graph in FIG. 2 is a simulation result of calculating transmission characteristics relative to a distance d (mm) between the human body and the electrode (first electrode) in the state illustrated in the upper portion of FIG. 1 (i.e., during signal transmission). In the upper graph of FIG. 2, a characteristic in a case where the third electrode is not connected to the GND is indicated by a broken line, and a characteristic in a case where the third electrode is connected to the GND is indicated by a solid line.

As illustrated in the upper graph of FIG. 2, the characteristic in the case where the third electrode is connected to the GND is that: in a case where a distance d between the human body and the electrode is larger than 0.1 mm, the characteristic is slightly more deteriorated than the characteristic in the case of not being connected to the GND, but in a case where the distance d between the human body is less than 0.1 mm, the characteristic is more sufficiently improved than the characteristic in the case of not being connected to the GND.

On the other hand, a lower graph in FIG. 2 illustrates a simulation result of calculating a transmission characteristic relative to the distance d (mm) between the human body and the electrode (first electrode) in the state illustrated in the lower portion of FIG. 1 (i.e., during signal reception). In the lower graph of FIG. 2 also, a characteristic in the case where the third electrode is not connected to the GND is indicated by a broken line, and a characteristic in the case where the third electrode is connected to the GND is indicated by a solid line.

As illustrated in the lower graph of FIG. 2, the characteristic in the case where the third electrode is connected to GND falls below the characteristic in the case of not being connected to GND in an entire range.

The reason is that an apparent load is increased in the state in which the third electrode is connected to the GND, and a potential difference is hardly generated between the first electrode and the second electrode during reception. As a result, the transmission efficiency is deteriorated during reception in the electrode configuration in which the third electrode is connected to the GND.

Configuration of Transmitter/Receiver of Present Technology

Figure 3:
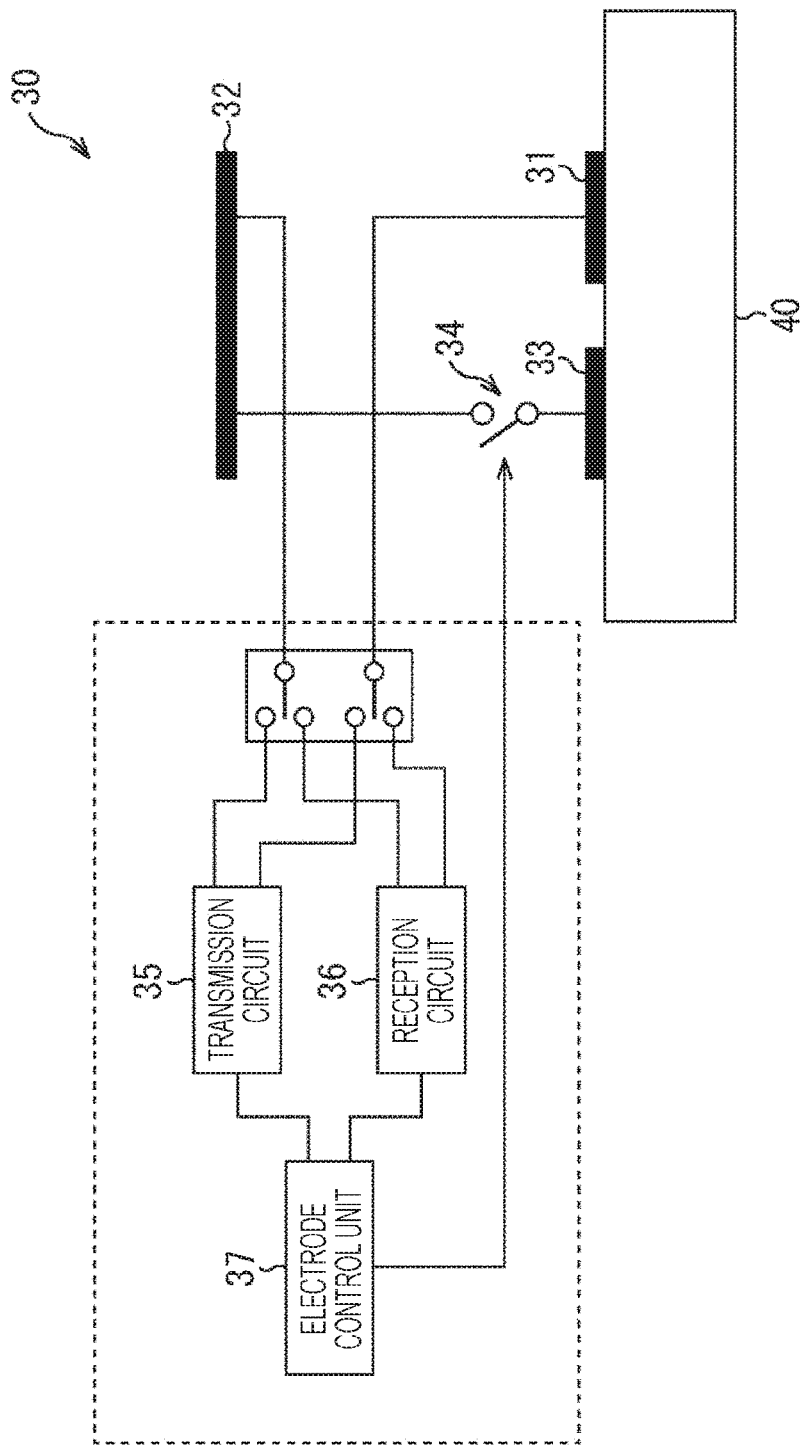
FIG. 3 is a block diagram illustrating an exemplary configuration of a transmitter/receiver according to the present technology.

FIG. 3 illustrates an exemplary configuration of a transmitter/receiver to which the present technology is applied.

A transmitter/receiver 30 illustrated in FIG. 3 transmits and receives a signal via a communication medium 40.

The transmitter/receiver 30 includes a first electrode 31, a second electrode 32, a third electrode 33, a switch 34, a transmission circuit 35, a reception circuit 36, and an electrode control unit 37.

The first electrode 31 is provided close to the communication medium 40, and the second electrode 32 is provided in a manner facing the first electrode 31. The first electrode 31 and the second electrode 32 constitute an electrode pair in order to transmit and receive a signal to be transmitted via the communication medium 40. The first electrode 31 is provided such that electrostatic coupling to the communication medium 40 is stronger than that of the second electrode 32. The second electrode 32 is connected to predetermined potential. In the following, the description will be mainly provided assuming that the second electrode 32 is connected to GND, however; the first electrode 31 may also be connected to the GND.

The third electrode 33 is provided close to the communication medium 40 together with the first electrode 31.

The switch 34 is provided between the second electrode 32 and the third electrode 33 and electrically connects the second electrode 32 to the third electrode 33. In other words, in a case where the switch 34 is turned ON, potential of the third electrode 33 becomes equal to potential of the second electrode 32 (GND).

The transmission circuit 35 is provided between the first electrode 31 and the second electrode 32 and transmits a signal to a communication partner by generating, between these electrodes, an electric signal (potential difference) to be transmitted to the communication partner.

The reception circuit 36 is provided between the first electrode 31 and the second electrode 32, detects an electric signal (potential difference) generated between these electrodes by a signal transmitted via the communication medium 40, and receives a signal from the communication partner by restoring the electric signal.

The electrode control unit 37 controls electrical connection between the second electrode 32 and the third electrode 33 by turning ON or OFF (ON/OFF) the switch 34.

The communication medium 40 includes a substance having a physical characteristic capable of transmitting an electric signal (e.g., conductor, dielectric, or the like). For example, the communication medium 40 may include a conductor represented by a metal such as copper, iron, or aluminum, a dielectric represented by pure water, rubber, glass, or the like, or a living body that is a composite thereof, or alternatively, may include a material having both of a property as a conductor and a property as a dielectric, like electrolytic solution such as saline solution.

Furthermore, the communication medium 40 may have any kind of shape. For example, the communication medium 40 may have a linear shape, a plate shape, a spherical shape, a prismatic shape, a cylindrical shape, or the like, or may have any arbitrary shape other than these shapes.

In the following, a description will be provided assuming that the communication medium 40 is a human body.

Arrangement of Electrodes

Here, arrangement of the first electrode 31, second electrode 32, and third electrode 33 will be described with reference to FIG. 4.

The first electrode 31 is formed in a manner having an area smaller than an area of the second electrode 32 and also smaller than an area of the third electrode 33. In an example of FIG. 4, among the three electrodes, the area of the second electrode 32 is sufficiently larger than the area of each of the first electrode 31 and the third electrode 33, and the area of the first electrode 31 and the area of the third electrode 33 are substantially the same.

The first electrode 31 and the third electrode 33 are located close to the communication medium 40 respectively, and provided on a substantially same plane. However, a gap length between the first electrode 31 and the second electrode 32 is formed shorter than a gap length between the second electrode 32 and the third electrode 33.

Figure 4:
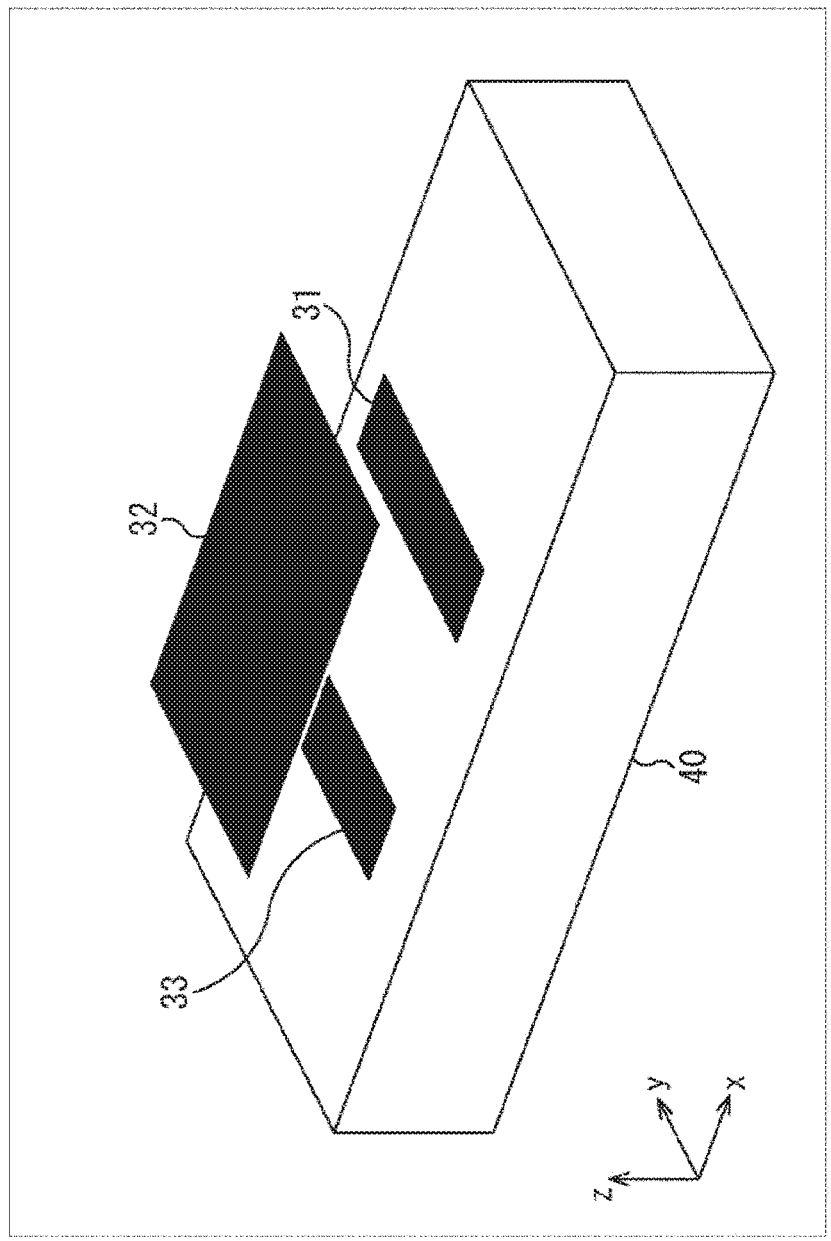
FIG. 4 is a view to describe arrangement of electrodes.

Additionally, in FIG. 4, in a case where a signal transmission direction is defined as an x direction, it is assumed that the first electrode 31 and the third electrode 33 are arranged side by side in a direction parallel to the x direction. With this arrangement, electric field intensity in the view of an xz plane can be more enhanced.

Electrode Control Processing

Figure 5:
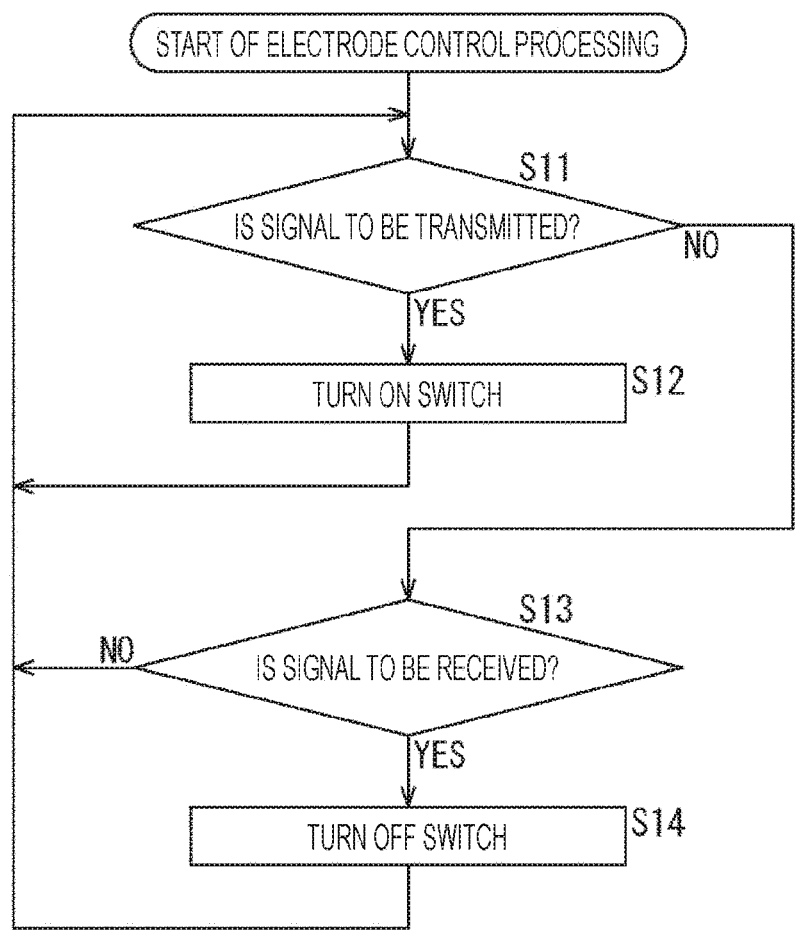
FIG. 5 is a flowchart to describe electrode control processing.

Next, electrode control processing of the transmitter/receiver 30 will be described with reference to a flowchart of FIG. 5.

In step S11, the electrode control unit 37 determines whether the transmission circuit 35 transmits a signal. In a case where it is determined that the transmission circuit 35 transmits a signal, the processing proceeds to step S12.

Figure 6:
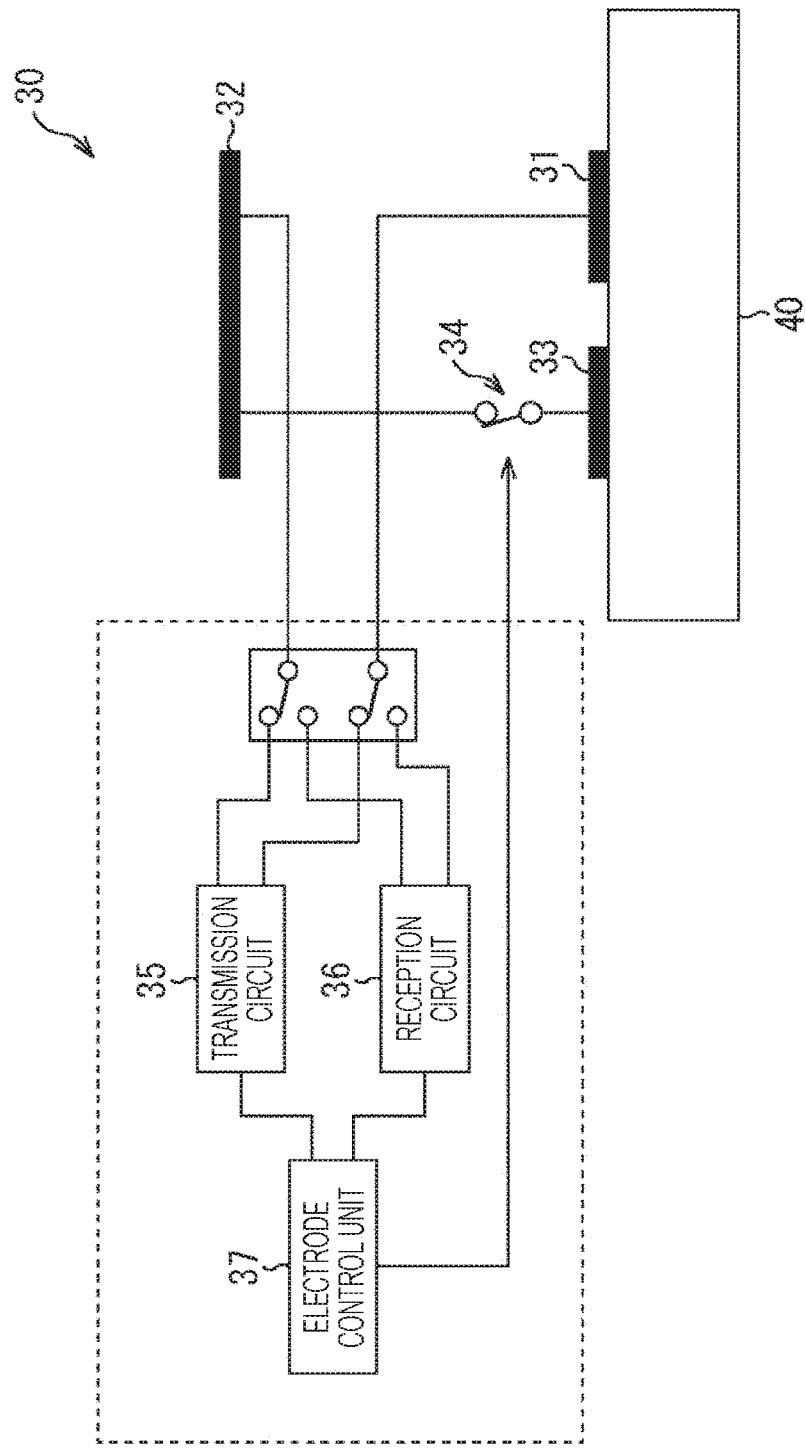
FIG. 6 is a diagram illustrating a state of a transmitter/receiver during transmission.

In step S12, as illustrated in FIG. 6, the electrode control unit 37 electrically connects the second electrode 32 to the third electrode 33 by turning ON the switch 34. In other words, the third electrode 33 is connected to the GND during signal transmission.

On the other hand, in a case where it is determined in step S11 that the transmission circuit 35 does not transmit a signal, the processing proceeds to step S13.

In step S13, the electrode control unit 37 determines whether the reception circuit 36 transmits a signal. In a case where it is determined that the reception circuit 36 receives a signal, the processing proceeds to step S14.

Figure 7:
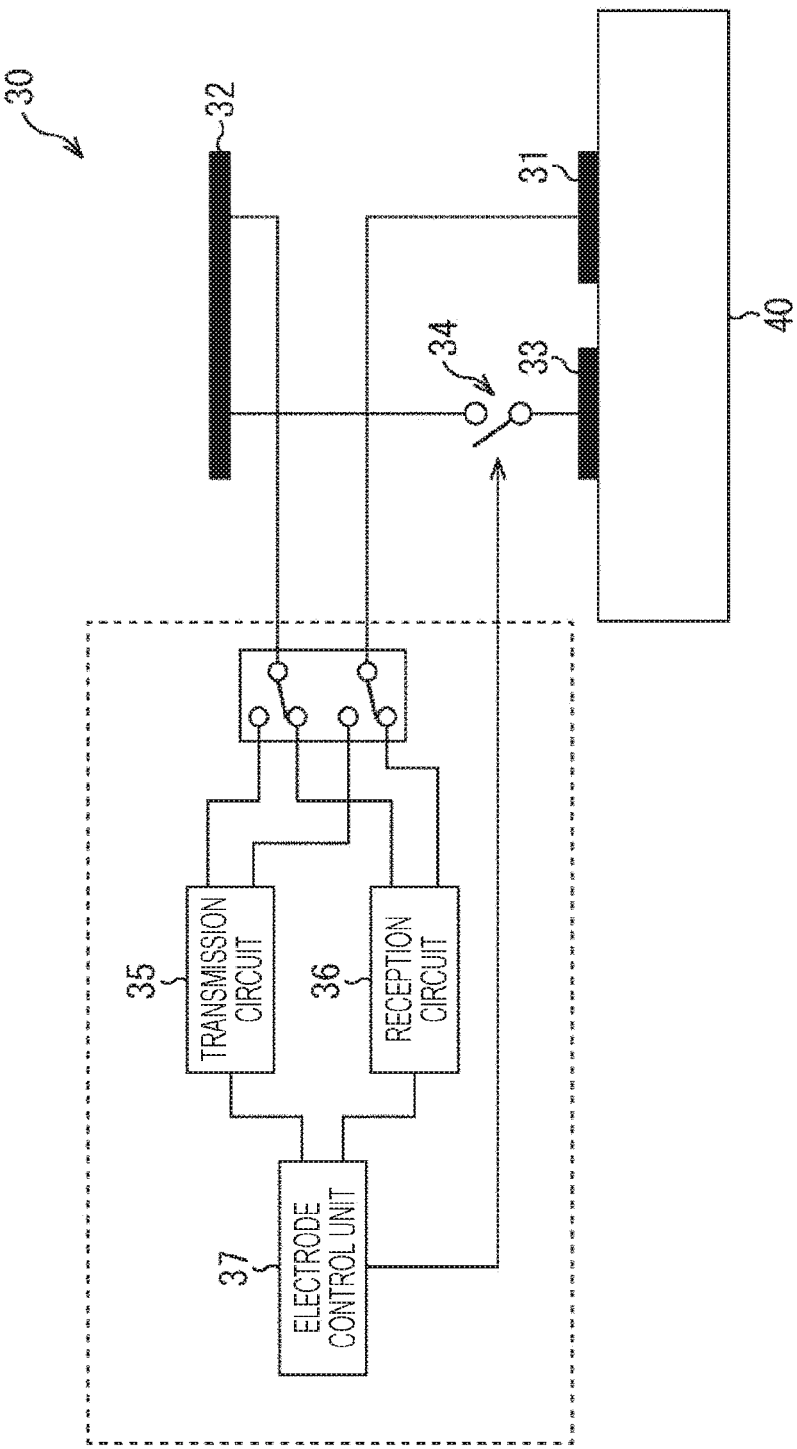
FIG. 7 is a diagram illustrating a state of the transmitter/receiver during reception.

In step S14, as illustrated in FIG. 7, the electrode control unit 37 does not allow electrical connection between the second electrode 32 and the third electrode 33 by turning OFF the switch 34. In other words, during signal reception, the third electrode 33 is not connected to the GND.

According to the above-described processing, the third electrode 33 is connected to the GND during signal transmission, and the third electrode 33 is not connected to the GND during signal reception. Therefore, deterioration of transmission efficiency during reception can be suppressed while maintaining transmission efficiency during transmission.

Exemplary Internal Configurations of IC

Figure 8:
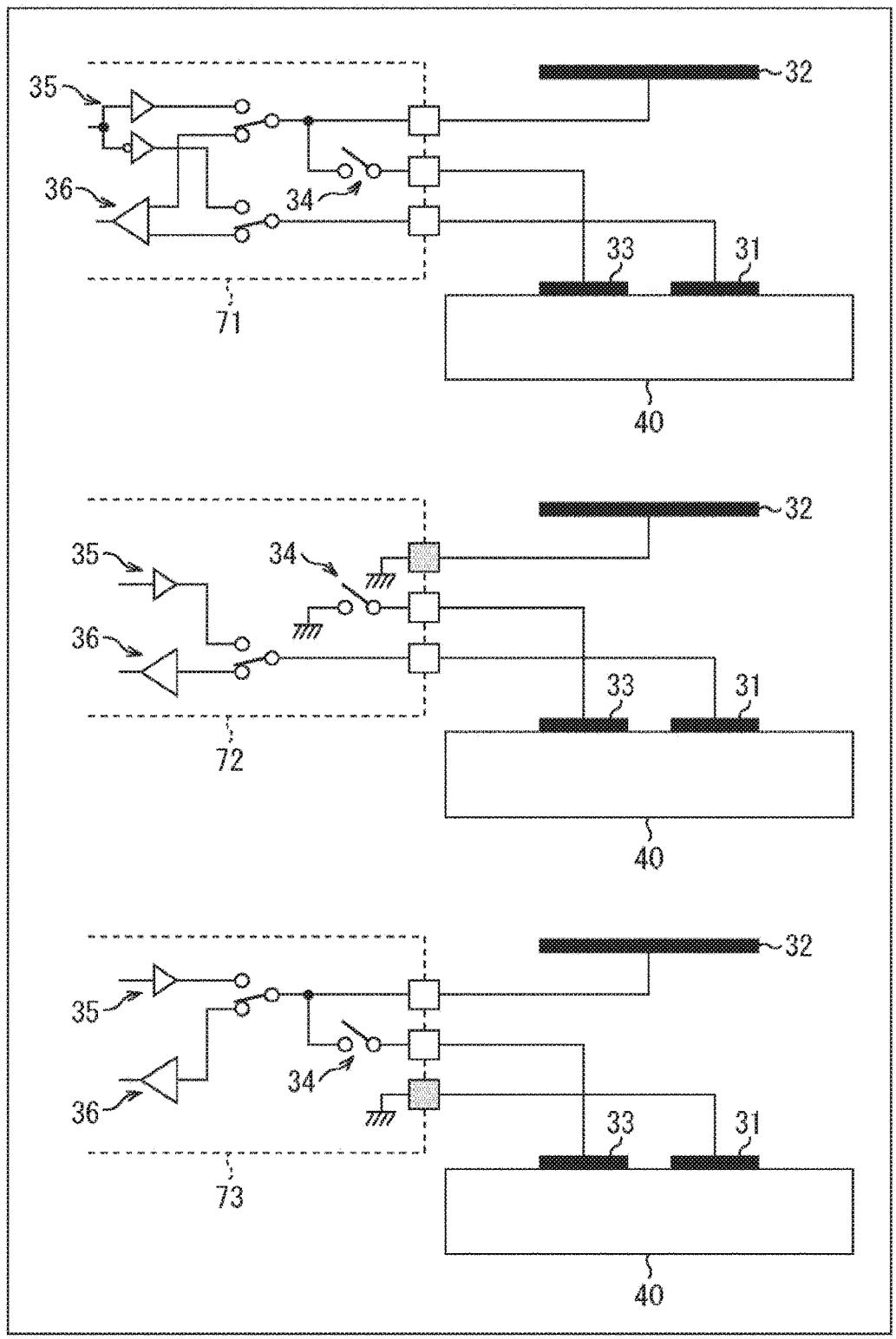
FIG. 8 is a diagram to describe exemplary internal configurations of an IC.

In the transmitter/receiver 30 described above, components excluding the three electrodes can be integrated into one integrated circuit (IC) as illustrated in FIG. 8.

In an upper portion of FIG. 8, illustrated is a configuration in which the components excluding the three electrodes are integrated in an IC 71. The IC 71 is formed as a differential input circuit, and includes the switch 34, transmission circuit 35, and reception circuit 36.

In a middle portion of FIG. 8, illustrated is a configuration in which the components excluding the three electrodes are integrated in an IC 72. The IC 72 is formed as a single-ended input circuit and includes the switch 34, transmission circuit 35, and reception circuit 36. The IC 72 has a configuration in which the second electrode 32 is connected to the GND.

In a lower portion of FIG. 8, illustrated in a configuration in which the components excluding the three electrodes are integrated in an IC 73. The IC 73 is also formed as a single-ended input circuit and includes the switch 34, transmission circuit 35, and reception circuit 36. The IC 73 has a configuration in which the first electrode 31 is connected to the GND.

With the ICs having the above described configurations, the transmitter/receiver 30 of the present technology can be implemented.

Power Consumption During Transmission

Figure 9:
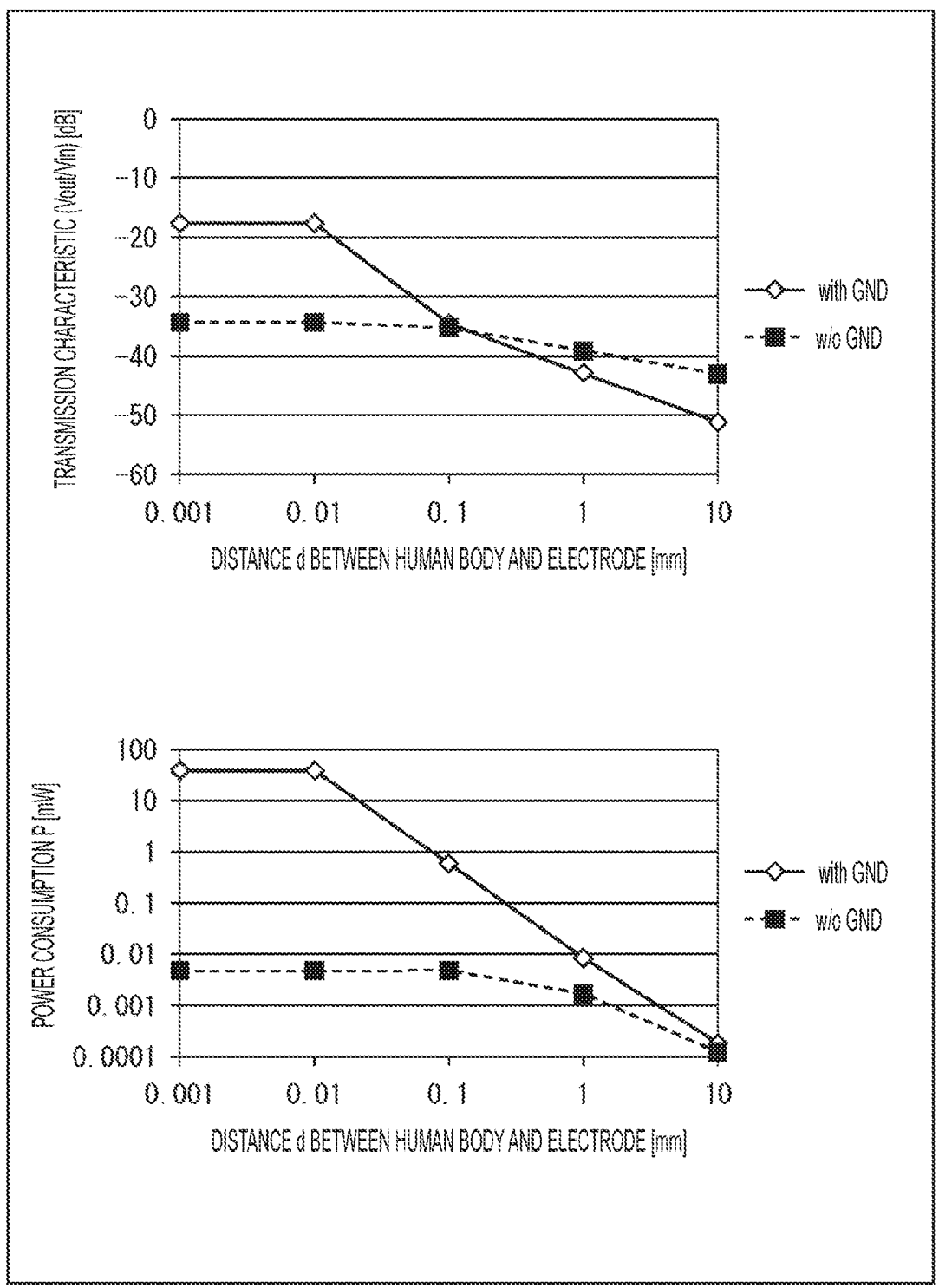
FIG. 9 is a diagram illustrating transmission characteristics and power consumption of the communication system during transmission in the related art.

As described above, in the communication system in the related art, in a case where the distance d between the human body (communication medium) and the electrode (first electrode) is small (d≤0.1) during signal transmission, a transmission characteristic is improved by connecting the third electrode to the GND as illustrated in an upper portion of FIG. 9.

However, in the communication system in the related art, the shorter the distance between the human body and the electrode is, the more increased power consumption is in the case where the third electrode is connected to the GND during signal transmission (solid line in the drawing), compared to power consumption in a case of not being connected to the GND (broken line in the drawing) as illustrated in the lower portion of FIG. 9.

In other words, in the communication system in the related art, the transmission characteristic is improved by connecting the third electrode to the GND, but the power consumption is increased during signal transmission.

Therefore, in the following, a configuration that suppresses increase of power consumption during signal transmission will be described.

Another Exemplary Configuration of Transmitter/Receiver

Figure 10:
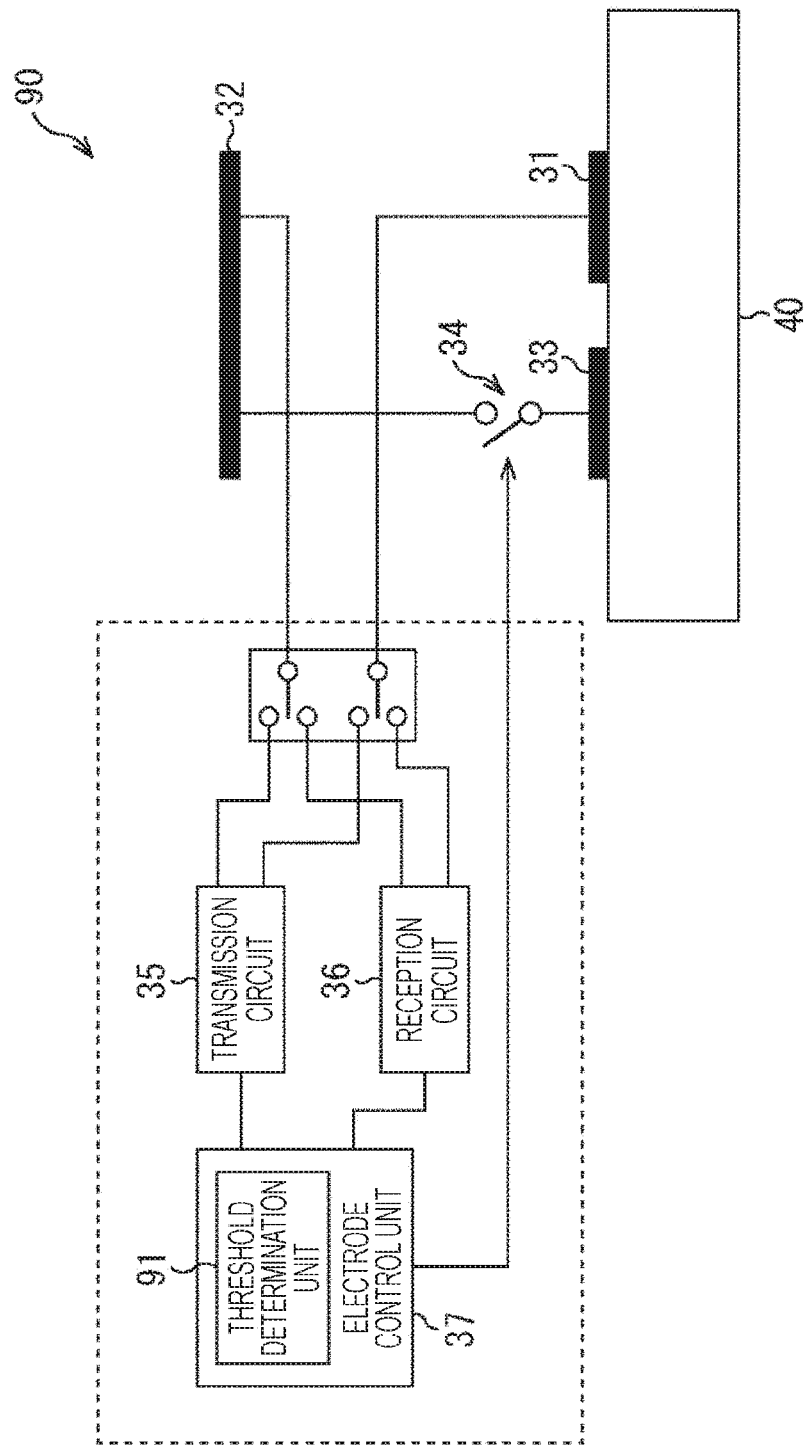
FIG. 10 is a block diagram illustrating another exemplary configuration of the transmitter/receiver of the present technology.

FIG. 10 illustrates another exemplary configuration of a transmitter/receiver to which the present technology is applied.

The transmitter/receiver 90 illustrated in FIG. 10 basically includes components similar to those of the transmitter/receiver 30 described with reference to FIG. 3.

In the transmitter/receiver 90, the electrode control unit 37 includes a threshold determination unit 91.

When the transmission circuit 35 transmits a signal, the threshold determination unit 91 determines whether power consumption required for signal transmission exceeds a predetermined threshold. The electrode control unit 37 controls electrical connection between the second electrode 32 and the third electrode 33 by turning ON/OFF the switch 34 on the basis of a determination result of the threshold determination unit 91.

Electrode Control Processing During Transmission

Next, electrode control processing of the transmitter/receiver 90 during transmission will be described with reference to the flowchart of FIG. 11.

Figure 11:
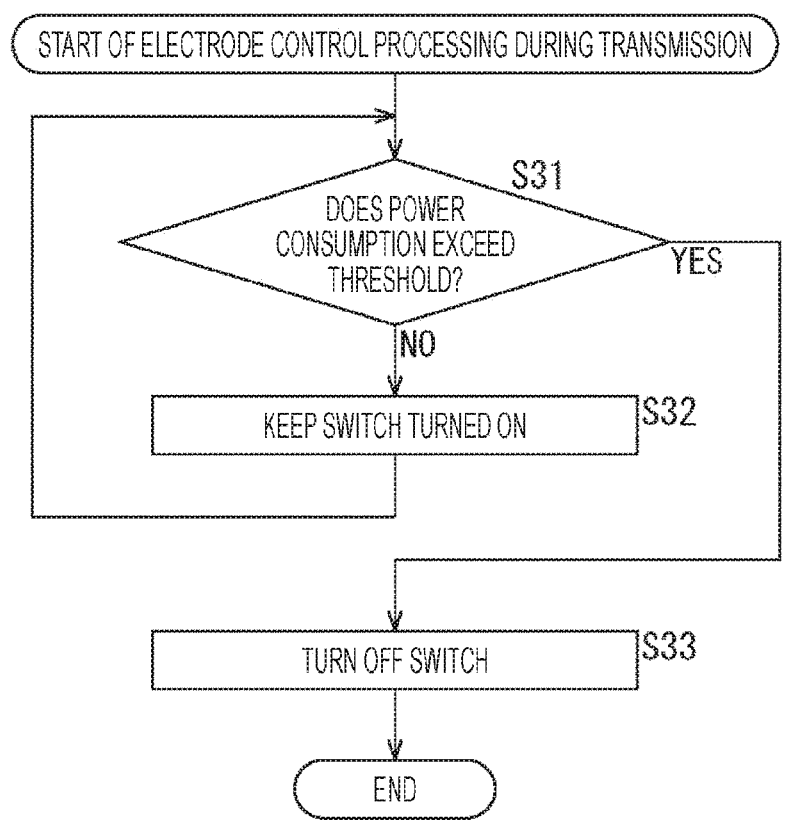
FIG. 11 is a flowchart to describe electrode control processing during transmission.

The processing of FIG. 11 is executed when the transmitter/receiver 90 transmits a signal. Therefore, the processing of FIG. 11 is started with the switch 34 turned ON.

In step S31, the threshold determination unit 91 determines whether power consumption required for signal transmission by the transmission circuit 35 exceeds the predetermined threshold. The threshold determination unit 91 compares, with the predetermined threshold, power consumption calculated by monitoring, for example, a potential difference generated between the first electrode 31 and the second electrode 32, a current value inside the transmission circuit 35, or the like.

In step S31, in a case where it is determined that power consumption required for signal transmission does not exceed the predetermined threshold, the processing proceeds to step S32.

In step S32, the electrode control unit 37 keeps the switch 34 turned ON. In other words, the second electrode 32 and the third electrode 33 are kept electrically connected.

On the other hand, in a case where it is determined in step S31 that power consumption required for signal transmission exceeds the predetermined threshold, the processing proceeds to step S33.

In step S33, the electrode control unit 37 turns OFF the switch 34. In other words, the electrical connection between the second electrode 32 and the third electrode 33 is disconnected.

According to the above processing, in a case where power consumption exceeds the predetermined threshold during signal transmission, connection between the third electrode and the GND is disconnected. With this processing, increase in power consumption can be suppressed.

In the above description, the configuration in which the threshold determination unit 91 determines whether power consumption required for signal transmission exceeds the predetermined threshold has been described. But, not limited thereto, the threshold determination unit 91 may determine whether electric field intensity generated by signal transmission exceeds a predetermined threshold, for example.

Figure 12:
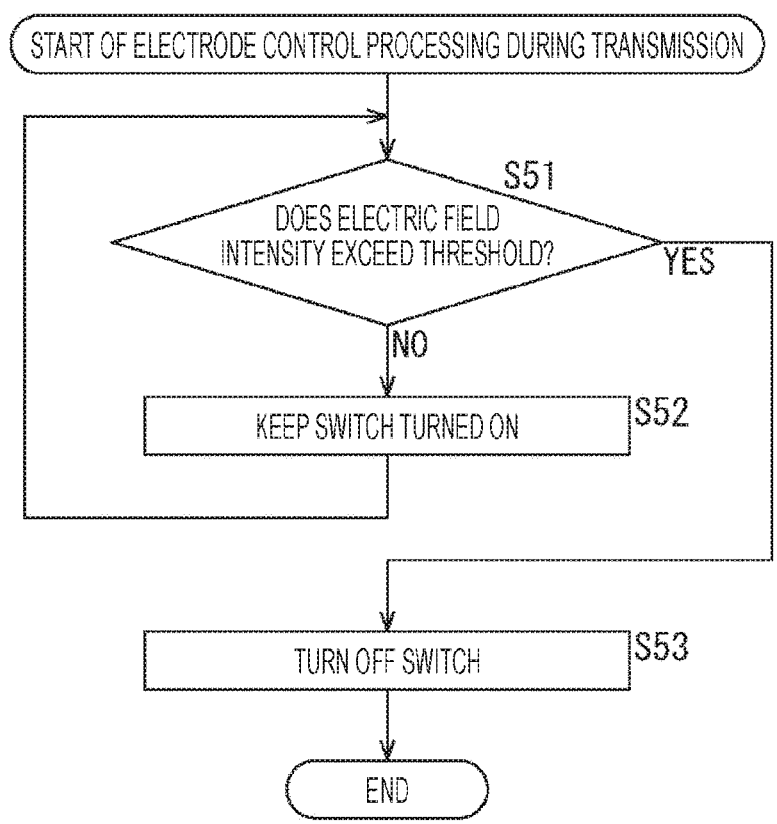
FIG. 12 is a flowchart to describe the electrode control processing during transmission.

In this case, electrode control processing as illustrated in a flowchart of FIG. 12 is executed in the transmitter/receiver 90 during signal transmission.

The processing in FIG. 12 is also executed when the transmitter/receiver 90 transmits a signal. Therefore, the processing in FIG. 12 is also started with the switch 34 turned ON.

In step S51, the threshold determination unit 91 determines whether electric field intensity generated by signal transmission performed by the transmission circuit 35 exceeds a predetermined threshold. The threshold determination unit 91 compares, with the predetermined threshold, electric field intensity between the first electrode 31 and the second electrode 32 measured by, for example, a sensor (not illustrated) or the like.

In step S51, in a case where it is determined that the electric field intensity generated by the signal transmission does not exceed the predetermined threshold, the processing proceeds to step S52.

In step S52, the electrode control unit 37 keeps the switch 34 turned ON. In other words, the second electrode 32 and the third electrode 33 are kept electrically connected.

On the other hand, in a case where it is determined in step S51 that the power consumption required for signal transmission exceeds the predetermined threshold, the processing proceeds to step S53.

In step S53, the electrode control unit 37 turns OFF the switch 34. In other words, electrical connection between the second electrode 32 and the third electrode 33 is disconnected.

According to the above processing, in the case where the electric field intensity exceeds the predetermined threshold during signal transmission, connection between the third electrode and the GND is disconnected. With this processing, influence of electric field intensity on the human body can be suppressed.

Meanwhile, the third electrode 33 is not used during signal reception in the transmitter/receiver 30 described with reference to FIG. 3.

Therefore, a configuration in which the third electrode 33 is effectively utilized during signal reception will be described in the following.

Still Another Exemplary Configuration of Transmitter/Receiver

Figure 13:
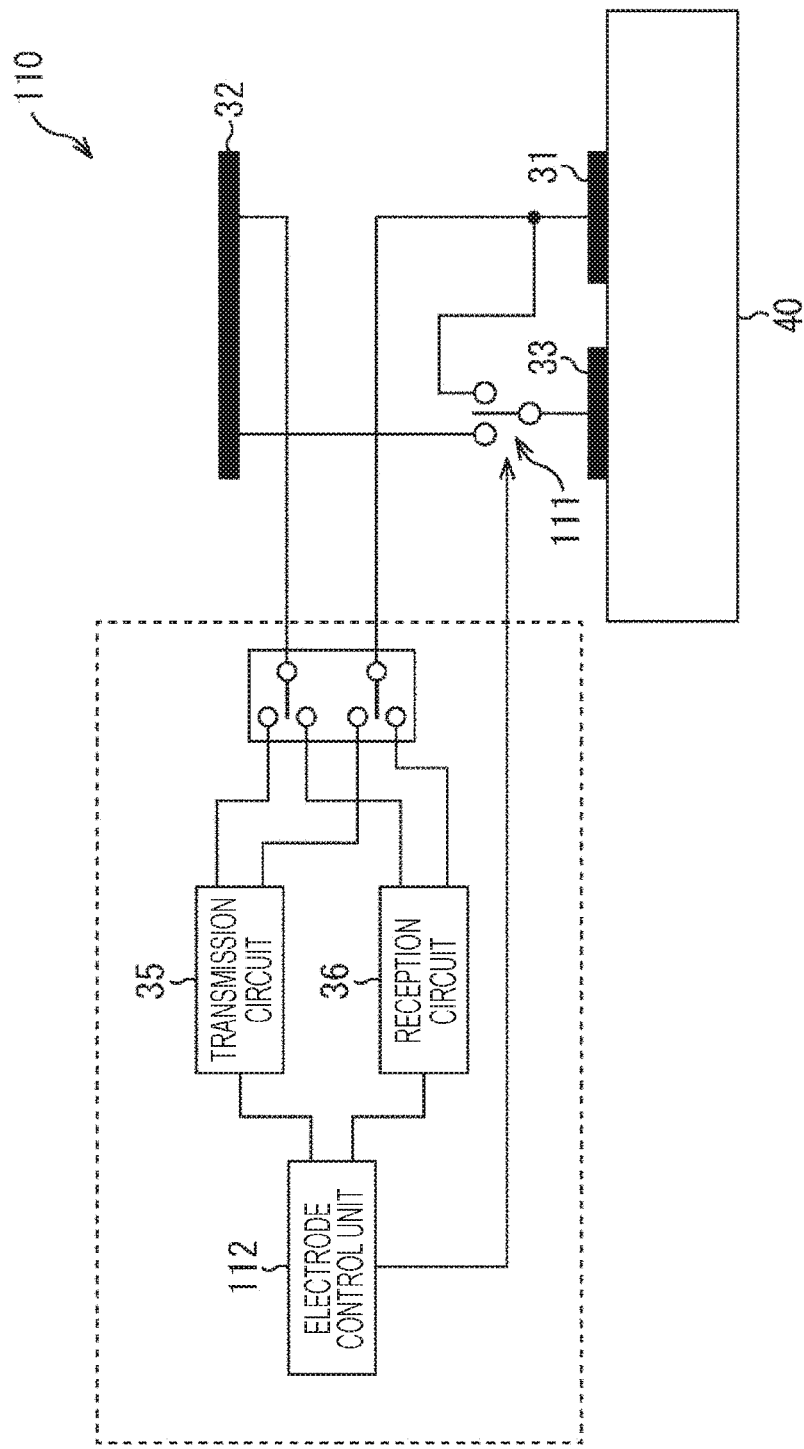
FIG. 13 is a block diagram illustrating another exemplary configuration of the transmitter/receiver of the present technology.

FIG. 13 illustrates still another exemplary configuration of a transmitter/receiver to which the present technology is applied.

In a transmitter/receiver 110 illustrated in FIG. 13, a switch 111 and an electrode control unit 112 are provided in place of the switch 34 and the electrode control unit 37 in the transmitter/receiver 30 described with reference to FIG. 3.

Similar to the switch 34, the switch 111 has a function to electrically connect the second electrode 32 to the third electrode 33 and has a further function to electrically connect the first electrode 31 to the third electrode 33. Note that a switch connecting the second electrode 32 to the third electrode 33 and a switch to connect the first electrode 31 to the third electrode 33 may also be separately provided.

The electrode control unit 112 controls electrical connection between the first electrode 31 and the third electrode 33 in addition to electrical connection between the second electrode 32 and the third electrode 33 by operating the switch 111.

Figure 14:
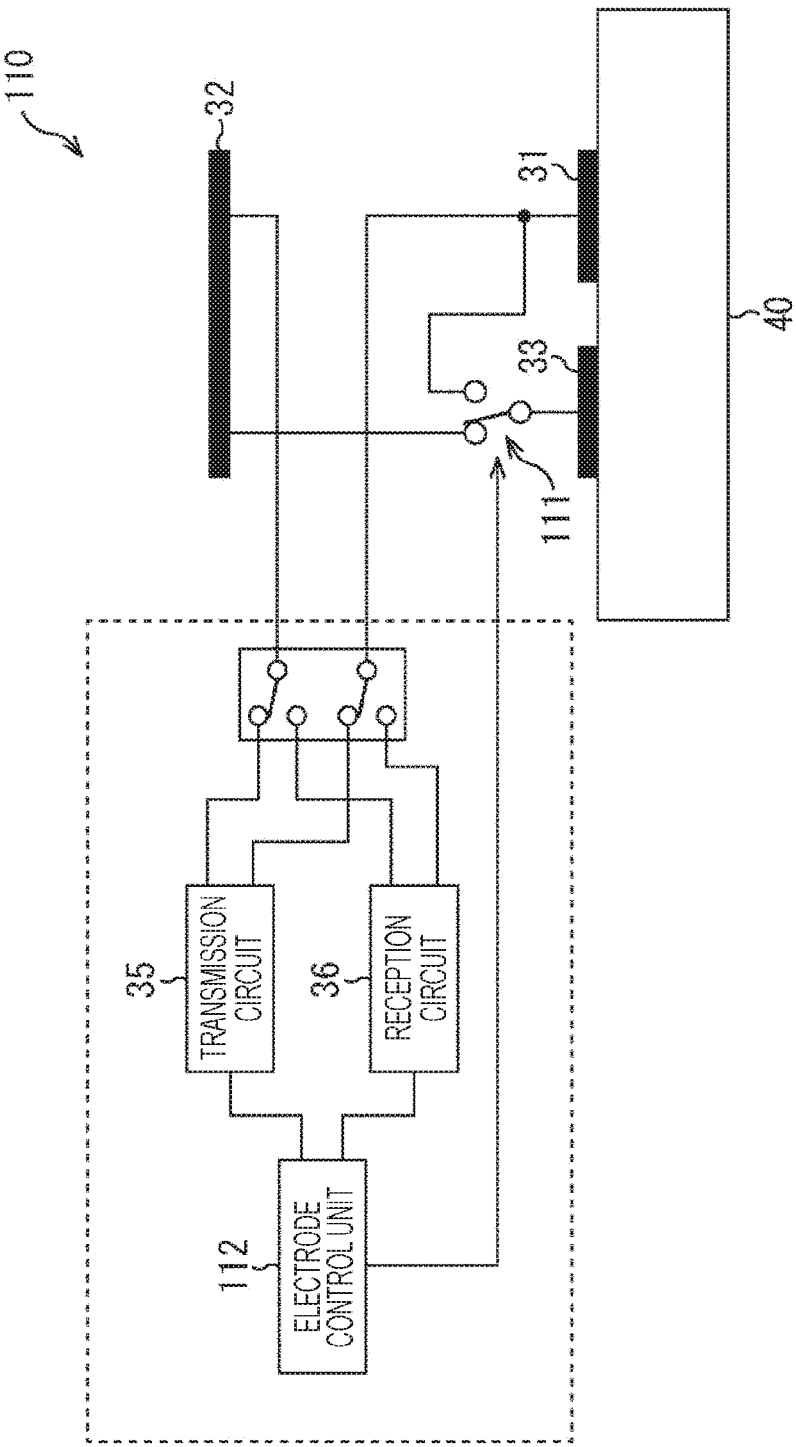
FIG. 14 is a diagram illustrating a state of a transmitter/receiver during transmission.

More specifically, as illustrated in FIG. 14, the electrode control unit 112 electrically connects the second electrode 32 to the third electrode 33 by turning ON the switch 111 to the second electrode 32 side during signal transmission. In other words, the third electrode 33 is connected to the GND during signal transmission.

Figure 15:
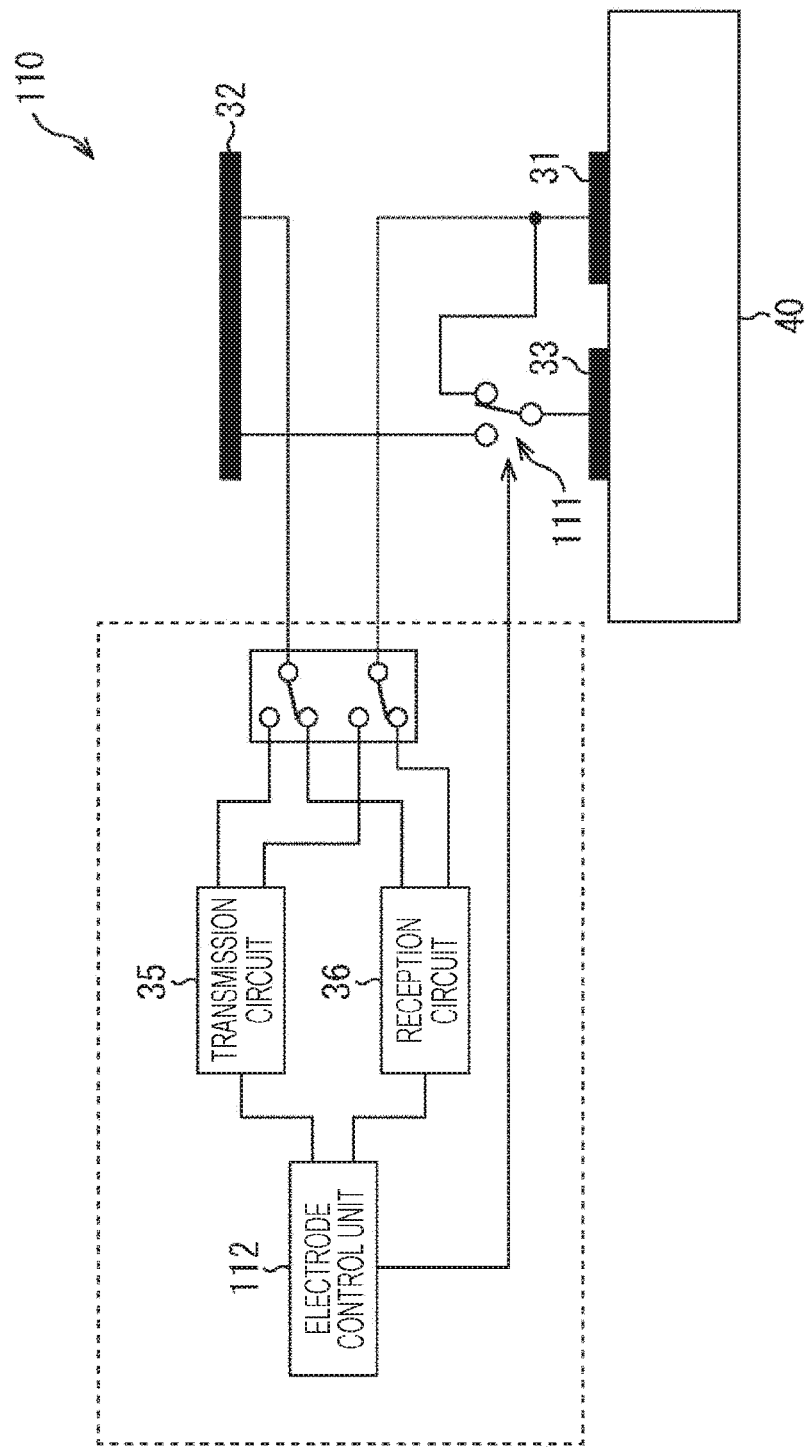
FIG. 15 is a diagram illustrating a state of the transmitter/receiver during reception.

On the other hand, as illustrated in FIG. 15, the electrode control unit 112 electrical connects the first electrode 31 to the third electrode 33 by turning ON the switch 111 to the first electrode 31 side during signal reception.

According to the above-described configuration, the first electrode 31 and the third electrode 33 become electrodes on the human body side during signal reception. Consequently, coupling between the human body and the electrode becomes stronger (in other words, capacitance between the human body and the electrode is increased or impedance between the human body and the electrode is reduced), and a signal level of a received signal can be increased.

Exemplary Internal Configurations of IC

Figure 16:
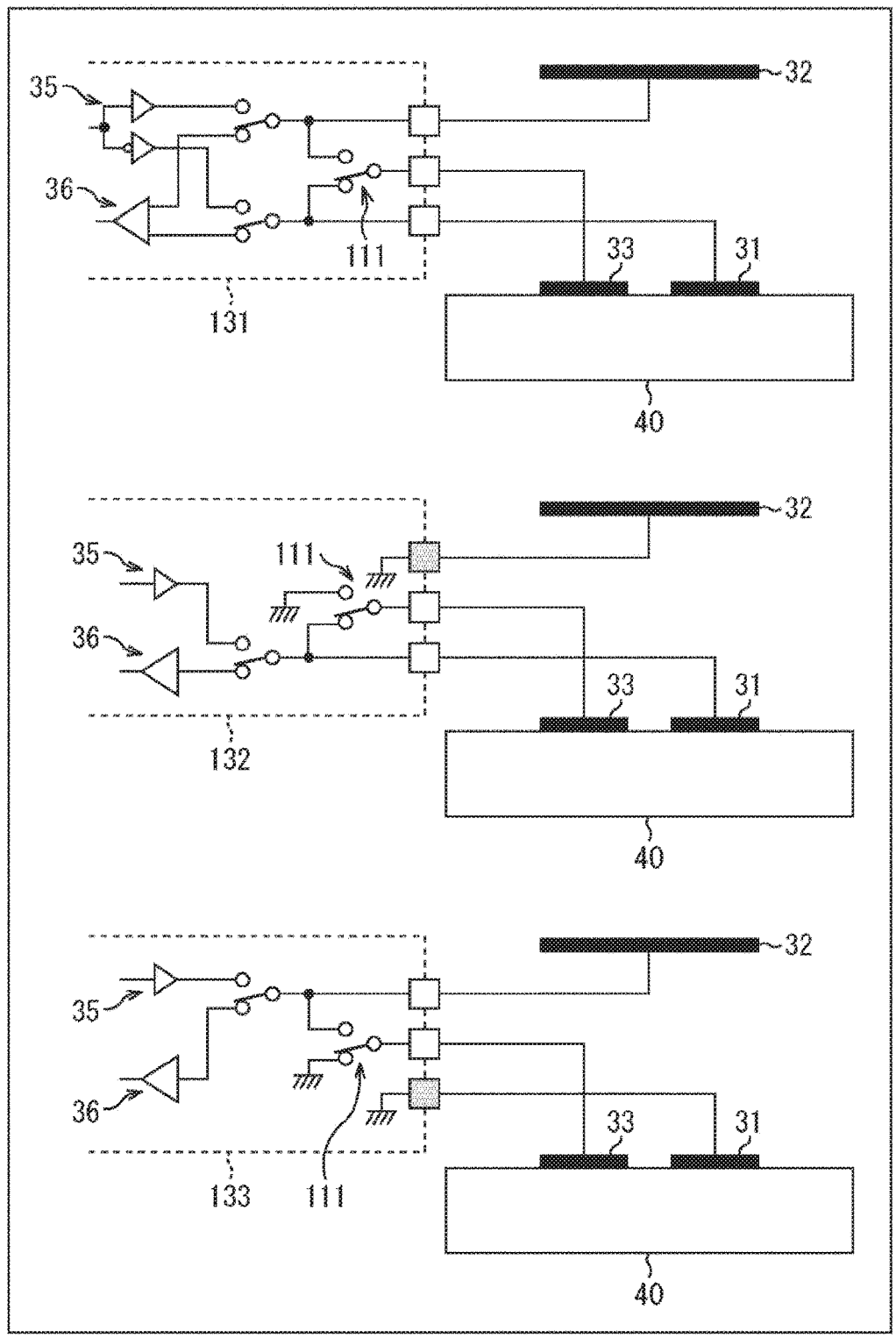
FIG. 16 is a diagram to describe exemplary internal configurations of an IC.

In the above-described transmitter/receiver 110, components excluding the three electrodes can also be integrated in one IC as illustrated in FIG. 16.

In an upper portion of FIG. 16, illustrated is a configuration in which the components excluding the three electrodes are integrated in an IC 131. The IC 131 is formed as a differential input circuit, and includes the switch 111, transmission circuit 35, and reception circuit 36.

In a middle portion of FIG. 16, illustrated is a configuration in which the components excluding the three electrodes are integrated in an IC 132. The IC 132 is formed as a single-ended input circuit and includes the switch 111, transmission circuit 35, and reception circuit 36. The IC 132 has a configuration in which the second electrode 32 is connected to the GND.

In a lower portion of FIG. 16, illustrated in a configuration in which the components excluding the three electrodes are integrated in an IC 133. The IC 133 is also formed as a single-ended input circuit and includes the switch 111, transmission circuit 35, and reception circuit 36. The IC 133 has a configuration in which the first electrode 31 is connected to the GND.

With the ICs having the above-described configurations, the transmitter/receiver 110 of the present technology can be implemented.

Data Transmission in Electric Field Communication System

Figure 17:
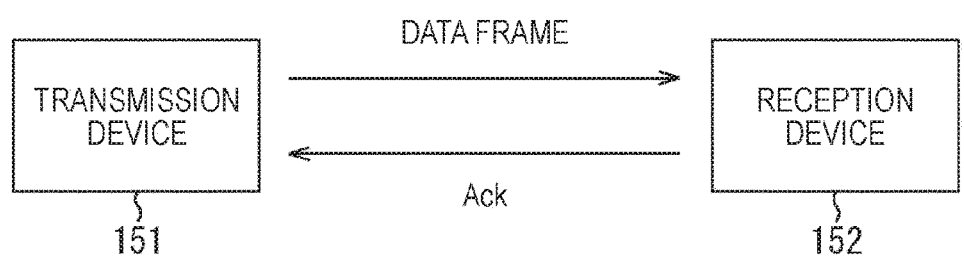
FIG. 17 is a diagram to describe transmission of a data frame.

FIG. 17 illustrates a general exemplary configuration of an electric field communication system via a communication medium such as a human body.

In the electric field communication system of FIG. 17, a transmission device 151 transmits a signal including a data frame to a reception device 152. When the data frame from the transmission device 151 is correctly received, the reception device 152 transmits an Ack signal in order to notify the transmission device 151 of a fact of the reception.

Figure 18:
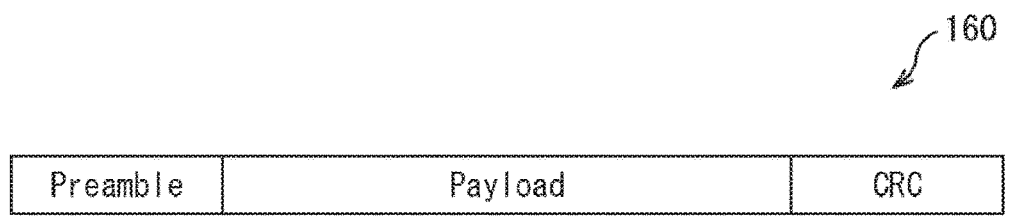
FIG. 18 is a diagram illustrating an exemplary configuration of a data frame.

FIG. 18 illustrates an exemplary data frame transmitted in the electric field communication system.

A data frame 160 illustrated in FIG. 18 includes a preamble, a payload, and a cyclic redundancy check (CRC). The payload includes a data command. Additionally, the CRC is used to detect whether a data command is correctly read (error detection).

Figure 19:
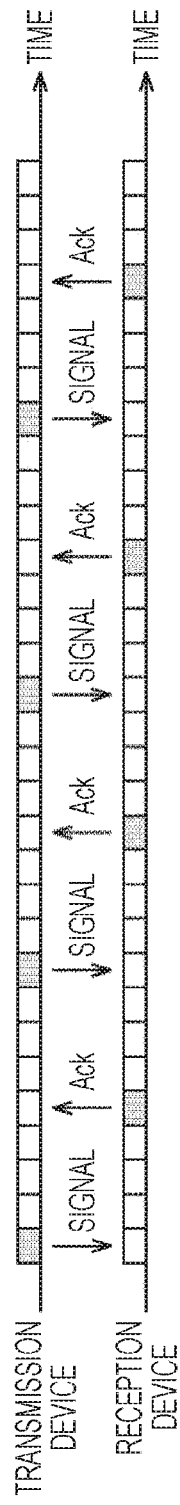
FIG. 19 is a diagram to describe transmission error.
Figure 19:
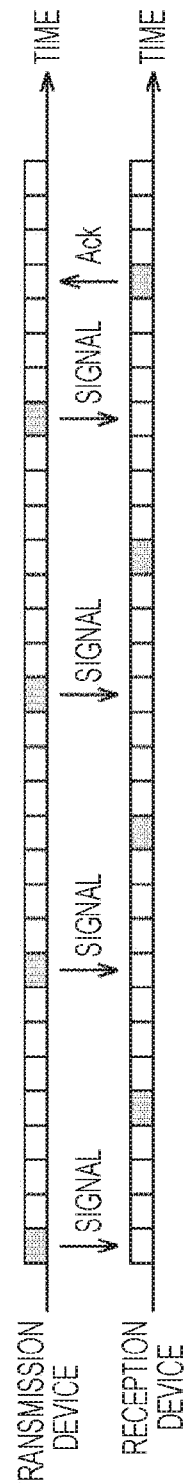

Therefore, in the electric field communication system of FIG. 17, in a case where there is no transmission error in a signal from the transmission device 151, the reception device 152 transmits an Ack signal to the transmission device 151 every time a signal is received as illustrated in an upper portion of FIG. 19.

On the other hand, in a case where there is a transmission error in a signal from the transmission device 151, the reception device 152 does not transmit an Ack signal to the transmission device 151 until a signal is correctly received as illustrated in a lower portion of FIG. 19. In the examples of FIG. 19, the reception device 152 transmits an Ack signal to the transmission device 151 in response to fourth transmission from the transmission device 151.

In an electric field communication system via a communication medium such as a human body, transmission efficiency may be deteriorated by an environment. As a result, a transmission error may occur in a signal from a transmission side.

Therefore, a configuration that improves transmission efficiency will be described in the following.

Figure 20:
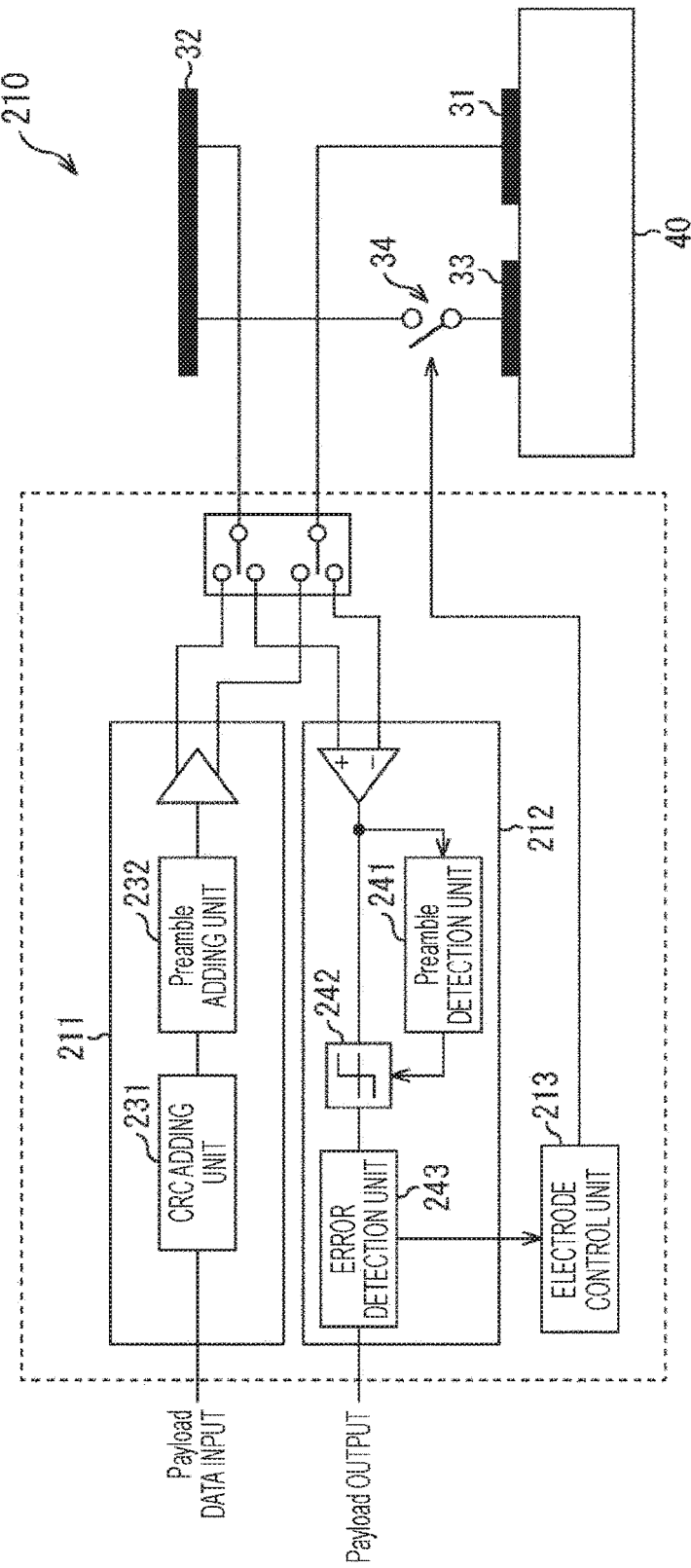
FIG. 20 is a block diagram illustrating still another exemplary configuration of the transmitter/receiver of the present technology.

First Exemplary Configuration of Transmitter/Receiver That Improves Transmission Efficiency FIG. 20 illustrates a first exemplary configuration of a transmitter/receiver that improves transmission efficiency.

In a transmitter/receiver 210 illustrated in FIG. 20, a transmission circuit 211, a reception circuit 212, and an electrode control unit 213 are provided in place of the transmission circuit 35, reception circuit 36, and electrode control unit 37 in the transmitter/receiver 30 described with reference to FIG. 3.

The transmission circuit 211 includes a CRC adding unit 231 and a preamble adding unit 232. The CRC adding unit 231 adds a CRC to payload data generated by a data generation unit not illustrated. The preamble adding unit 232 adds a preamble to the payload data added with the CRC. Thus, a data frame is generated. The transmission circuit 211 transmits a signal including the generated data frame to a communication partner.

The reception circuit 212 includes a preamble detection unit 241, a payload/CRC extraction unit 242, and an error detection unit 243. The preamble detection unit 241 detects a preamble from a data frame included in a received signal. The payload/CRC extraction unit 242 extracts a payload and a CRC from the data frame included in the received signal by using timing information of the detected preamble. The error detection unit 243 performs error detection for a data frame on the basis of the CRC out of the extracted payload and CRC. In a case where no error is detected, the reception circuit 212 outputs a payload to a data processing unit not illustrated. Note that error detection performed by the error detection unit 243 is performed on the basis of a different code such as a checksum, not limited to a CRC.

The electrode control unit 213 controls electrical connection between the second electrode 32 and the third electrode 33 by turning ON/OFF the switch 34 on the basis of an error detection result by the error detection unit 243.

Next, electrode control processing of the transmitter/receiver 210 during reception will be described with reference to the flowchart of FIG. 21.

Figure 21:
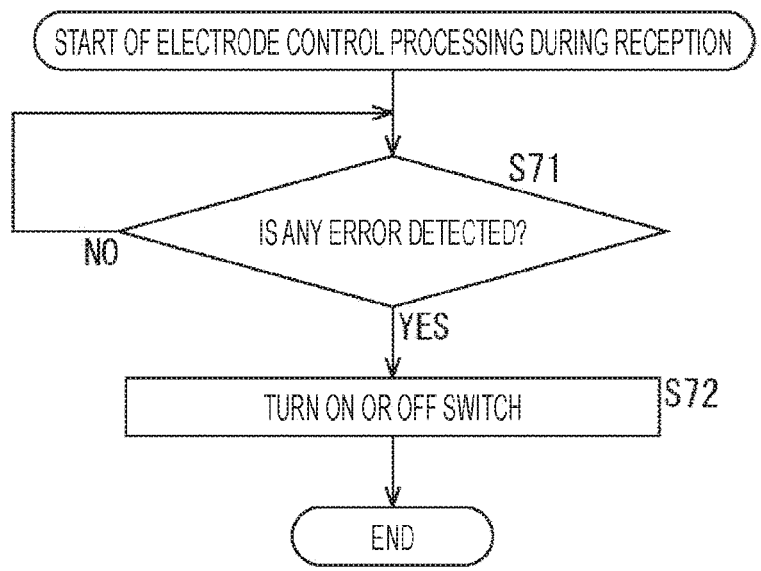
FIG. 21 is a flowchart to describe electrode control processing during reception.

The processing in FIG. 21 is executed when the transmitter/receiver 210 receives a signal. At this point, the switch 34 may be in the ON state or the OFF state.

In step S71, the electrode control unit 213 determines whether any error of a data frame is detected by the error detection unit 243. In a case where it is determined that no error is detected, the electrode control unit 213 does nothing and the processing repeats step S71.

On the other hand, in a case where it is determined in step S71 that an error is detected, the processing proceeds to step S72.

In step S72, the electrode control unit 213 turns ON or OFF the switch 34. More specifically, when errors in a data frame more than predetermined number are detected from a signal received within a predetermined time, the switch 34 is turned ON or OFF. In other words, in a case where the switch 34 is in the OFF state, the electrode control unit 213 turns ON the switch 34 so as to connect the second electrode 32 to the third electrode 33, and in a case where the switch 34 is in the ON state, the electrode control unit 213 disconnects connection between the second electrode 32 and the third electrode 33 by turning OFF the switch 34.

Figure 22:
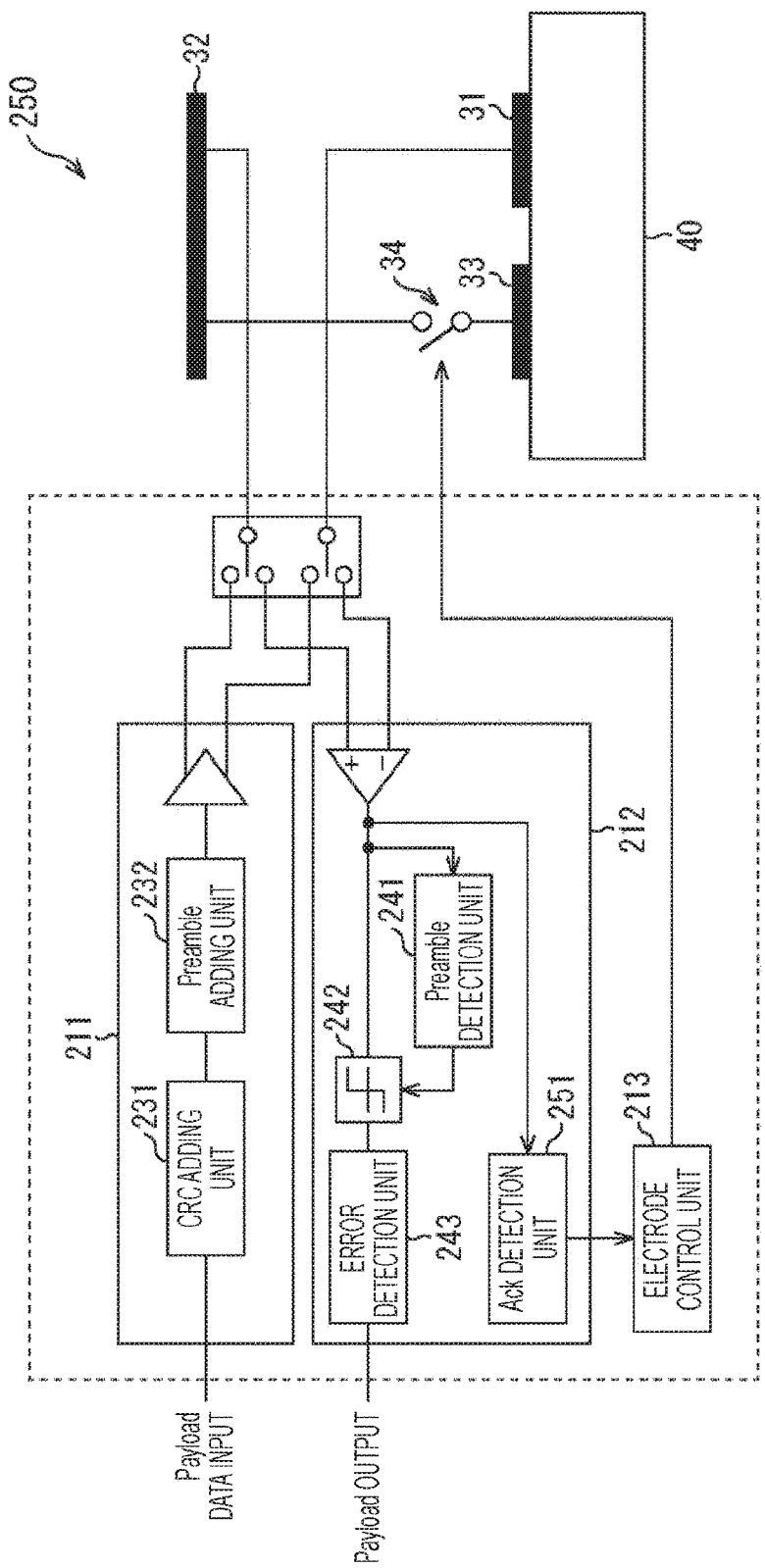
FIG. 22 is a block diagram illustrating another different exemplary configuration of the transmitter/receiver of the present technology.

Second Exemplary Configuration of Transmitter/Receiver That Improves Transmission Efficiency FIG. 22 illustrates a second exemplary configuration of a transmitter/receiver that improves transmission efficiency.

In a transmitter/receiver 250 illustrated in FIG. 22, an Ack detection unit 251 is additionally provided in the reception circuit 212 of the transmitter/receiver 210 described with reference to FIG. 20 in addition to the respective components similar to those in FIG. 20.

The Ack detection unit 251 detects reception of an Ack signal from a communication partner in response to a signal transmitted to the communication partner by the transmission circuit 211.

The electrode control unit 213 in FIG. 22 controls electrical connection between the second electrode 32 and the third electrode 33 by turning ON/OFF the switch 34 on the basis of a detection result of reception of an Ack signal by the Ack detection unit 251.

Next, electrode control processing of the transmitter/receiver 250 during reception will be described with reference to the flowchart of FIG. 23.

Figure 23:
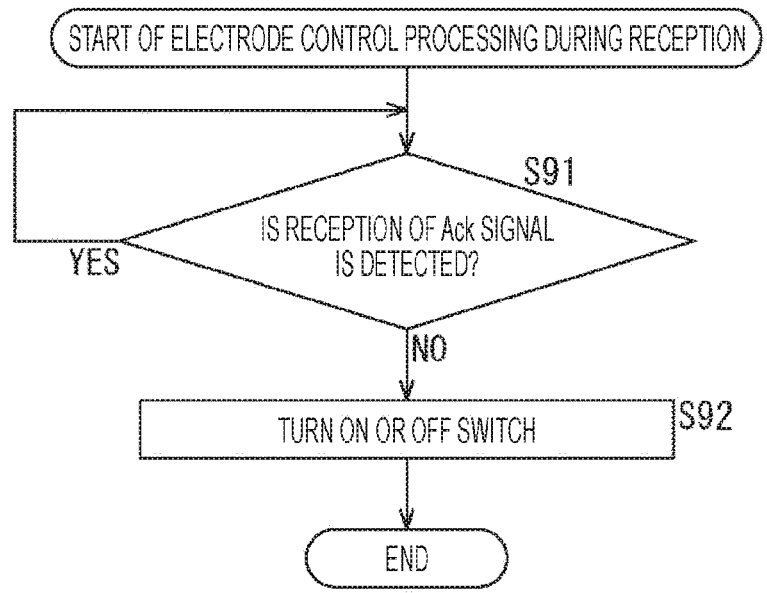
FIG. 23 is a flowchart to describe electrode control processing during reception.

The processing in FIG. 23 is executed when the transmitter/receiver 250 transmits a signal to a communication partner and waits for reception of an Ack signal from the communication partner. At this point, the switch 34 may be in the ON state or the OFF state.

In step S91, the electrode control unit 213 determines whether reception of an Ack signal is detected by the Ack detection unit 251. In a case where it is determined that reception of an Ack signal is detected, the electrode control unit 213 does nothing and the processing repeats the step S91.

On the other hand, in a case where it is determined in step S91 that reception of an Ack signal is not detected, the processing proceeds to step S92.

In step S92, the electrode control unit 213 turns ON or OFF the switch 34. More specifically, when reception of Ack signals more than predetermined number is not detected within a predetermined time, the switch 34 is turned ON or OFF. In other words, in a case where the switch 34 is in the OFF state, the electrode control unit 213 turns ON the switch 34 so as to connect the second electrode 32 to the third electrode 33, and in a case where the switch 34 is in the ON state, the electrode control unit 213 disconnects connection between the second electrode 32 and the third electrode 33 by turning OFF the switch 34.

Figure 24:
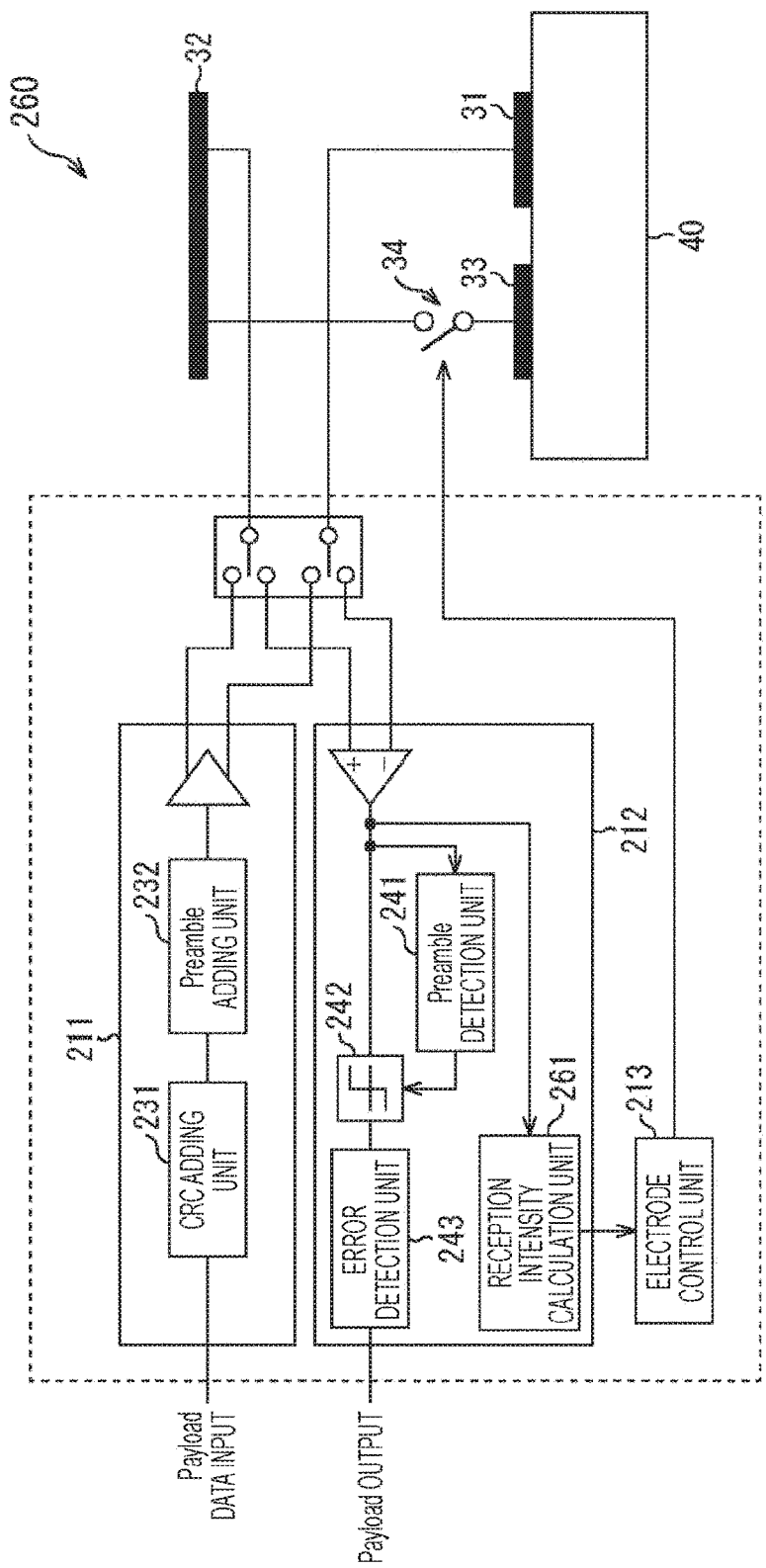
FIG. 24 is a block diagram illustrating still another different exemplary configuration of the transmitter/receiver of the present technology.

Third Exemplary Configuration of Transmitter/Receiver That Improves Transmission Efficiency FIG. 24 illustrates a third exemplary configuration of a transmitter/receiver that improves transmission efficiency.

In a transmitter/receiver 260 illustrated in FIG. 24, a reception intensity calculation unit 261 is additionally provided in addition to the respective components similar to those in FIG. 20 in the reception circuit 212 of the transmitter/receiver 210 described with reference to FIG. 20.

The reception intensity calculation unit 261 calculates a received signal strength indicator (RSSI) indicating reception intensity of a signal received in the reception circuit 212 on the basis of voltage of a signal received in the reception circuit 212.

The electrode control unit 213 in FIG. 24 controls electrical connection between the second electrode 32 and the third electrode 33 by turning ON/OFF the switch 34 on the basis of a calculation result of the RSSI by the reception intensity calculation unit 261.

Next, electrode control processing of the transmitter/receiver 250 during reception will be described with reference to the flowchart of FIG. 25.

Figure 25:
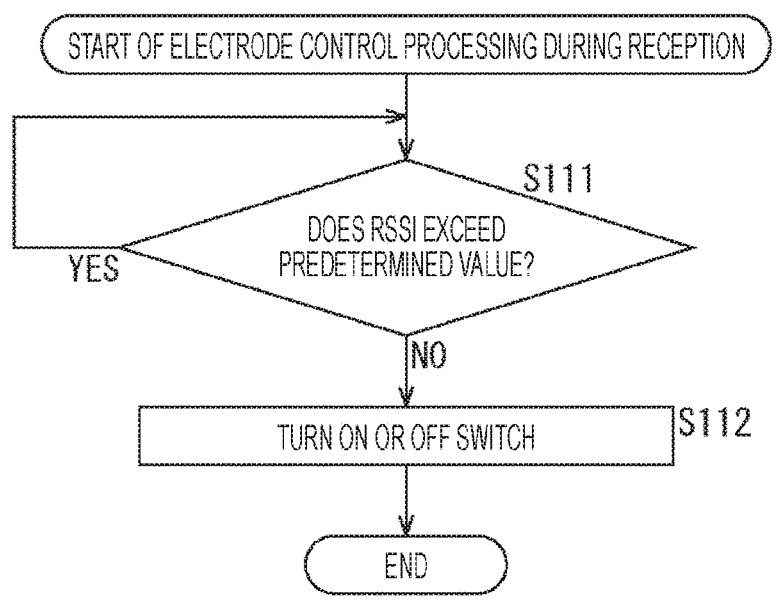
FIG. 25 is a flowchart to describe electrode control processing at reception.

The processing in FIG. 25 is executed when the transmitter/receiver 250 receives a signal. At this point, the switch 34 may be in the ON state or in the OFF state.

In step S111, the electrode control unit 213 determines whether the RSSI exceeds a predetermined value on the basis of a calculation result of the RSSI by the reception intensity calculation unit 261. In a case where it is determined that the RSSI exceeds the predetermined value, the electrode control unit 213 does nothing and the processing repeats the step S111.

On the other hand, in a case where it is determined in step S111 that the RSSI does not exceed the predetermined value, the processing proceeds to step S112.

In step S112, the electrode control unit 213 turns ON or OFF the switch 34. More specifically, when the RSSI is smaller than the predetermined value, that is, when signal intensity of a received signal is low, the switch 34 is turned ON or OFF. In other words, in a case where the switch 34 is in the OFF state, the electrode control unit 213 turns ON the switch 34 so as to connect the second electrode 32 to the third electrode 33, and in a case where the switch 34 is in the ON state, the electrode control unit 213 disconnects connection between the second electrode 32 and the third electrode 33 by turning OFF the switch 34.

According to the above-described configurations and processing, even in a case where transmission efficiency is deteriorated by an environment and a transmission error occurs in a signal from a transmission side, improvement of transmission efficiency can be expected by switching the connection state between the second electrode and the third electrode and changing an environment on a reception side.

Meanwhile, the embodiments of the present technology is not limited to the above-described embodiment, and various kinds of modifications can be made within a range without departing from a gist of the present technology.

Furthermore, the present technology can also have following configurations.

(1)
A transmitter/receiver including:
a first electrode provided close to a communication medium;
a second electrode provided in a manner facing the first electrode;
a third electrode provided close to the communication medium together with the first electrode;
a transmission circuit connected to the first electrode and the second electrode so as to transmit the signal;
a reception circuit connected to the first electrode and the second electrode so as to receive the signal;
a switch adapted to electrically connect the second electrode to the third electrode; and
an electrode control unit adapted to control electrical connection between the second electrode and the third electrode by turning ON/OFF the switch.

(2)
The transmitter/receiver recited in (1), in which
the electrode control unit connects the second electrode to the third electrode during transmission of the signal; and
the electrode control unit does not connect the second electrode to the third electrode during reception of the signal.

(3)
The transmitter/receiver recited in (2), in which the electrode control unit disconnects connection between the second electrode and the third electrode in a case where power consumption required for transmission of the signal exceeds a predetermined value during transmission of the signal.

(4)
The transmitter/receiver recited in (2), in which the electrode control unit disconnects connection between the second electrode and the third electrode in a case where electric field intensity generated by transmission of the signal exceeds a predetermined value during transmission of the signal.

(5)
The transmitter/receiver recited in (2), further including an additional switch adapted to electrically connect the first electrode to the third electrode,
in which the electrode control unit connects the first electrode to the third electrode by turning ON the additional switch during reception of the signal.

(6)
The transmitter/receiver recited in (1), in which the electrode control unit connects the second electrode to the third electrode or disconnects the connection when an error is detected in data included in the signal received in the reception circuit.

(7)
The transmitter/receiver recited in (6), in which the electrode control unit connects the second electrode to the third electrode or disconnects the connection when errors in the data more than predetermined number are detected from the signal received within a predetermined time.

(8)
The transmitter/receiver recited in (6) or (7), in which error detection for the data is performed on the basis of a cyclic redundancy check (CRC) of the received signal.

(9)
The transmitter/receiver recited in (1), in which the electrode control unit connects the second electrode and the third electrode or disconnects the connection when reception of an Ack signal in response to the signal transmitted from the transmission circuit is not detected.

(10)
The transmitter/receiver recited in (9), in which the electrode control unit connects the second electrode to the third electrode or disconnects the connection when reception of Ack signals more than predetermined number is not detected within a predetermined time.

(11)
The transmitter/receiver recited in (1), in which the electrode control unit connects the second electrode to the third electrode or disconnects the connection on the basis of a received signal strength indicator (RSSI) of the signal received in the reception circuit.

(12)
The transmitter/receiver recited in any one of (1) to (11), in which an area of the first electrode is smaller than an area of the second electrode and also smaller than an area of the third electrode.

(13)
The transmitter/receiver recited in any one of (1) to (12), in which the first electrode and the third electrode are provided on a substantially same plane.

(14)
The transmitter/receiver recited in (13), in which a gap length between the first electrode and the second electrode is shorter than a gap length between the first electrode and the third electrode.

(15)
The transmitter/receiver recited in any one of (1) to (14), in which the first electrode and the third electrode are arranged side by side in a direction parallel to a transmission direction of the signal.

(16)
The transmitter/receiver recited in any one of (1) to (15), in which the communication medium is a human body.

(17)
A transmitting/receiving method including controlling electrical connection between a second electrode and a third electrode by a transmitter/receiver turning ON/OFF a switch,
in which the transmitter/receiver includes:
a first electrode provided close to a communication medium;
the second electrode provided in a manner facing the first electrode;
the third electrode provided close to the communication medium together with the first electrode;
a transmission circuit connected to the first electrode and the second electrode so as to transmit a signal;
a reception circuit connected to the first electrode and the second electrode so as to receive the signal; and
the switch adapted to electrically connect the second electrode to the third electrode.

REFERENCE SIGNS LIST

30 Transmitter/receiver
31 First electrode
32 Second electrode
33 Third electrode
34 Switch
35 Transmission circuit
36 Reception circuit
37 Electrode control unit
90 Transmitter/receiver
91 Threshold determination unit
110 Transmitter/receiver
111 Switch 112 Electrode control unit
210 Transmitter/receiver
211 Transmission circuit
212 Reception circuit
213 Electrode control unit
250 Transmitter/receiver
251 Ack detection unit
260 Transmitter/receiver
261 Reception intensity calculation unit

The invention claimed is:

1. A transmitter/receiver, comprising:
   a first electrode within a first specific distance from a communication medium;
   a second electrode that faces the first electrode;
   a third electrode within a second specific distance from the communication medium;
   a transmission circuit configured to transmit a signal, wherein the transmission circuit is connected to the first electrode and the second electrode;
   a reception circuit configured to receive the signal, wherein the reception circuit is connected to the first electrode and the second electrode;
   a switch configured to electrically connect the second electrode to the third electrode; and
   an electrode control unit configured to:
      control the electrical connection between the second electrode and the third electrode by one of a turn ON operation or a turn OFF operation of the switch,
      connect the second electrode to the third electrode during the transmission of the signal; and
      disconnect the electrical connection between the second electrode and the third electrode when power consumption required for the transmission of the signal exceeds a specific value during the transmission of the signal.

2. The transmitter/receiver according to claim 1, further comprising an additional switch configured to electrically connect the first electrode to the third electrode,
   wherein the electrode control unit is further configured to connect the first electrode to the third electrode by the turn ON operation of the additional switch during reception of the signal.

3. The transmitter/receiver according to claim 1, wherein:
   an area of the first electrode is smaller than an area of the second electrode, and
   the area of the first electrode is smaller than an area of the third electrode.

4. The transmitter/receiver according to claim 1, wherein the first electrode and the third electrode are on a same plane.

5. The transmitter/receiver according to claim 4, wherein a gap length between the first electrode and the second electrode is shorter than a gap length between the first electrode and the third electrode.

6. The transmitter/receiver according to claim 1, wherein the first electrode and the third electrode are side by side in a direction parallel to a transmission direction of the signal.

7. The transmitter/receiver according to claim 1, wherein the communication medium is a human body.

8. A transmitting/receiving method, comprising:
   controlling electrical connection between a second electrode and a third electrode by a transmitter/receiver that one of turns ON or turns OFF a switch, wherein the transmitter/receiver includes:
      a first electrode within a first specific distance from a communication medium;
      the second electrode that faces the first electrode;
      the third electrode within a second specific distance from the communication medium;
      a transmission circuit configured to transmit a signal, wherein the transmission circuit is connected to the first electrode and the second electrode;
      a reception circuit configured to receive the signal, wherein the reception circuit is connected to the first electrode and the second electrode; and
      the switch configured to electrically connect the second electrode to the third electrode;
   connecting the second electrode to the third electrode during the transmission of the signal; and
   disconnecting the electrical connection between the second electrode and the third electrode when power consumption required for the transmission of the signal exceeds a specific value during the transmission of the signal.

9. A transmitter/receiver, comprising:
   a first electrode within a first specific distance from a communication medium;
   a second electrode that faces the first electrode;
   a third electrode within a second specific distance from the communication medium;
   a transmission circuit configured to transmit a signal, wherein the transmission circuit is connected to the first electrode and the second electrode;
   a reception circuit configured to receive the signal, wherein the reception circuit is connected to the first electrode and the second electrode;
   a switch configured to electrically connect the second electrode to the third electrode; and
   an electrode control unit configured to:
      control the electrical connection between the second electrode and the third electrode by one of a turn ON operation or a turn OFF operation of the switch;
      connect the second electrode to the third electrode during the transmission of the signal; and
      disconnect the electrical connection between the second electrode and the third electrode when electric field intensity generated by the transmission of the signal exceeds a specific value during the transmission of the signal.

10. A transmitter/receiver, comprising:
    a first electrode within a first specific distance from a communication medium;
    a second electrode that faces the first electrode;
    a third electrode within a second specific distance from the communication medium;
    a transmission circuit configured to transmit a signal, wherein the transmission circuit is connected to the first electrode and the second electrode;
    a reception circuit configured to receive the signal, wherein the reception circuit is connected to the first electrode and the second electrode;
    a switch configured to electrically connect the second electrode to the third electrode; and
    an electrode control unit configured to:
       control the electrical connection between the second electrode and the third electrode by one of a turn ON operation or a turn OFF operation of the switch,
       wherein the second electrode is one of electrically connected or electrically disconnected from the third electrode based on detection of an error in data included in the received signal.

11. The transmitter/receiver according to claim 10, wherein the second electrode is one of electrically connected to or electrically disconnected from the third electrode, based on a number of errors in the data is more than a specific number, and the errors are detected from the signal received within a specific time.

12. The transmitter/receiver according to claim 10, wherein error detection for the data is based on a cyclic redundancy check (CRC) of the signal received.

13. A transmitter/receiver, comprising:
a first electrode within a first specific distance from a communication medium;
a second electrode that faces the first electrode;
a third electrode within a second specific distance from the communication medium;
a transmission circuit configured to transmit a signal, wherein the transmission circuit is connected to the first electrode and the second electrode;
a reception circuit configured to receive the signal, wherein the reception circuit is connected to the first electrode and the second electrode;
a switch configured to electrically connect the second electrode to the third electrode; and
an electrode control unit configured to:
control the electrical connection between the second electrode and the third electrode by one of a turn ON operation or a turn OFF operation of the switch, wherein:
the second electrode is one of electrically connected to or electrically disconnected from the third electrode based on detection of an error in data included in the received signal on reception of an acknowledgement signal, and
the acknowledgement signal is based on the transmitted signal.

14. The transmitter/receiver according to claim 13, wherein the second electrode is one of electrically connected to or electrically disconnected from the third electrode, when a number of Ack signals detected within a specific time is less than a specific number.

15. A transmitter/receiver, comprising:
a first electrode within a first specific distance from a communication medium;
a second electrode that faces the first electrode;
a third electrode with in a second specific distance from the communication medium;
a transmission circuit configured to transmit a signal, wherein the transmission circuit is connected to the first electrode and the second electrode;
a reception circuit configured to receive the signal, wherein the reception circuit is connected to the first electrode and the second electrode;
a switch configured to electrically connect the second electrode to the third electrode; and
an electrode control unit configured to:
control the electrical connection between the second electrode and the third electrode by one of a turn ON operation or a turn OFF operation of the switch,
wherein the second electrode is one of electrically connected or electrically disconnected from the third electrode based on a received signal strength indicator (RSSI) of the received signal.

* * * * *